US012690340B2

(12) United States Patent
Yang et al.

(10) Patent No.: US 12,690,340 B2
(45) Date of Patent: Jul. 21, 2026

(54) DISPLAY PANEL AND DISPLAY DEVICE

(71) Applicants: Yunnan Invensight Optoelectronics Technology Co., Ltd., Yunnan (CN); BOE Technology Group Co., Ltd., Beijing (CN)

(72) Inventors: Chao Yang, Beijing (CN); Xiaoyun Liu, Beijing (CN); Weiliang Bu, Beijing (CN); Kuanta Huang, Beijing (CN); Hongtao Yu, Beijing (CN); Dongdong Su, Beijing (CN); Zongshun Yang, Beijing (CN); Fushuang Zhang, Beijing (CN); Yunhao Zhang, Beijing (CN); Zhongxiang Yu, Beijing (CN)

(73) Assignees: YUNNAN INVENSIGHT OPTOELECTRONICS TECHNOLOGY CO., LTD., Kunming (CN); BOE TECHNOLOGY GROUP CO., LTD., Beijing (CN)

( * ) Notice: Subject to any disclaimer, the term of this patent is extended or adjusted under 35 U.S.C. 154(b) by 407 days.

(21) Appl. No.: 18/557,887

(22) PCT Filed: Nov. 7, 2022

(86) PCT No.: PCT/CN2022/130372
§ 371 (c)(1),
(2) Date: Oct. 27, 2023

(87) PCT Pub. No.: WO2023/093512
PCT Pub. Date: Jun. 1, 2023

(65) Prior Publication Data
US 2024/0373679 A1 Nov. 7, 2024

(30) Foreign Application Priority Data
Nov. 29, 2021 (WO) ................ PCT/CN2021/133886

(51) Int. Cl.
*H10K 59/122* (2023.01)
*H10K 50/19* (2023.01)
(Continued)

(52) U.S. Cl.
CPC ........... *H10K 59/122* (2023.02); *H10K 50/19* (2023.02); *H10K 59/1201* (2023.02); *H10K 59/80517* (2023.02); *H10K 71/60* (2023.02)

(58) Field of Classification Search
CPC .................................................. H10K 59/122
(Continued)

(56) References Cited

U.S. PATENT DOCUMENTS 10,811,491 B2 10/2020 Fan
10,826,027 B2 11/2020 Hu et al.
(Continued)

FOREIGN PATENT DOCUMENTS

CN 102272970 A 12/2011
CN 102916031 A 2/2013
(Continued)

OTHER PUBLICATIONS

Non-final Office Action of U.S. Appl. No. 17/920,626 dated May 7, 2025.
(Continued)

*Primary Examiner* — Christopher M Raabe
(74) *Attorney, Agent, or Firm* — Calfee, Halter & Griswold LLP

(57) ABSTRACT

The present disclosures relates to a display panel, including a driving backplane, first electrodes, a pixel definition layer, a light-emitting layer, and a second electrode. The first electrodes and the pixel definition layer are arranged on a side surface of the driving backplane; the pixel definition layer is provided with pixel openings for exposing the first electrodes, and a partition groove, which is located between
(Continued)

two adjacent pixel openings, and the boundary of each pixel opening is located within the boundary of the first electrode that is exposed therefrom; a side wall of each pixel opening is provided with a first cut-off groove, and a side wall of each partition groove is provided with a second cut-off groove; the light-emitting layer covers the pixel definition layer and the first electrodes; and the second electrode covers the light-emitting layer.

20 Claims, 12 Drawing Sheets

(51) Int. Cl.
    *H10K 59/12*     (2023.01)
    *H10K 59/80*     (2023.01)
    *H10K 71/60*     (2023.01)

(58) Field of Classification Search
    USPC ................................................ 313/498–512
    See application file for complete search history.

(56) References Cited

U.S. PATENT DOCUMENTS

| | | |
|---|---|---|
| 10,868,091 B2 | 12/2020 | Choi et al. |
| 10,971,551 B2 | 4/2021 | Wang |
| 11,088,226 B2 | 8/2021 | Gong et al. |
| 11,121,197 B2 | 9/2021 | Huang et al. |
| 12,185,590 B2 | 12/2024 | Kinjo |
| 2003/0132703 A1 | 7/2003 | Sakaguchi |
| 2010/0252857 A1 | 10/2010 | Nakatani et al. |
| 2011/0291086 A1 | 12/2011 | Nishiyama |
| 2014/0027731 A1 | 1/2014 | Kim et al. |
| 2014/0042400 A1 | 2/2014 | Kim |
| 2014/0353595 A1 | 12/2014 | Choi et al. |
| 2015/0144906 A1 | 5/2015 | Ichikawa |
| 2015/0208480 A1 | 7/2015 | Hosokawa et al. |
| 2016/0049613 A1 | 2/2016 | Kang et al. |
| 2016/0079325 A1 | 3/2016 | Lee et al. |
| 2016/0293888 A1 | 10/2016 | Shim et al. |
| 2017/0133620 A1 | 5/2017 | Lee et al. |
| 2017/0170243 A1 | 6/2017 | An et al. |
| 2019/0097161 A1 | 3/2019 | Im et al. |
| 2019/0131365 A1 | 5/2019 | Jung |
| 2019/0172898 A1 | 6/2019 | Choi |
| 2019/0181199 A1 | 6/2019 | Choi et al. |
| 2019/0229152 A1 | 7/2019 | Wang |
| 2020/0161393 A1 | 5/2020 | Huang et al. |
| 2020/0203469 A1 | 6/2020 | Li et al. |
| 2020/0212162 A1 | 7/2020 | Fan |
| 2021/0167145 A1 | 6/2021 | Gong et al. |
| 2022/0019305 A1 | 1/2022 | Ye |
| 2022/0115469 A1 | 4/2022 | Huang et al. |
| 2022/0393132 A1 | 12/2022 | Nishikawa et al. |
| 2024/0047471 A1 | 2/2024 | Huang et al. |
| 2024/0224639 A1* | 7/2024 | Yang ................... H10K 59/1201 |
| 2025/0380575 A1* | 12/2025 | Liang ................... H10K 59/122 |

FOREIGN PATENT DOCUMENTS

| | | |
|---|---|---|
| CN | 103311268 A | 9/2013 |
| CN | 106783924 A | 5/2017 |
| CN | 107170788 A | 9/2017 |
| CN | 107425131 A | 12/2017 |
| CN | 108242459 A | 7/2018 |
| CN | 109103217 A | 12/2018 |
| CN | 109119437 A | 1/2019 |
| CN | 109346505 A | 2/2019 |
| CN | 109599502 A | 4/2019 |
| CN | 110299469 A | 10/2019 |
| CN | 110364555 A | 10/2019 |
| CN | 110416279 A | 11/2019 |
| CN | 110416434 A | 11/2019 |
| CN | 110993806 A | 4/2020 |
| CN | 111244070 A | 6/2020 |
| CN | 111564484 A | 8/2020 |
| CN | 111627976 A | 9/2020 |
| CN | 111668380 A | 9/2020 |
| CN | 111722761 A | 9/2020 |
| CN | 112002827 A | 11/2020 |
| CN | 112133734 A | 12/2020 |
| CN | 112151690 A | 12/2020 |
| CN | 112531125 A | 3/2021 |
| CN | 109346505 B | 4/2021 |
| CN | 113066834 A | 7/2021 |
| CN | 113130598 A | 7/2021 |
| CN | 113193151 A | 7/2021 |
| CN | 113410268 A | 9/2021 |
| CN | 113659098 A | 11/2021 |
| CN | 116359098 A | 11/2021 |
| CN | 214588861 U | 11/2021 |
| CN | 214672621 U | 11/2021 |
| CN | 114335121 A | 4/2022 |
| CN | 114361222 A | 4/2022 |
| EP | 3496150 A1 | 6/2019 |
| EP | 3496150 B1 | 4/2020 |
| EP | 3642880 A1 | 4/2020 |
| JP | 2001060494 A | 3/2001 |
| JP | 2002313572 A | 10/2002 |
| JP | 2008039843 A | 2/2008 |
| JP | 5028900 B2 | 9/2012 |
| KR | 20060091665 A | 8/2006 |
| KR | 20080061918 A | 7/2008 |
| KR | 20080080974 A | 9/2008 |
| KR | 20200034158 A | 3/2020 |
| KR | 20200082491 A | 7/2020 |
| WO | 2018/233207 A1 | 12/2018 |
| WO | 2021023189 A1 | 2/2021 |
| WO | 2021085176 A1 | 5/2021 |
| WO | 2021139660 A1 | 7/2021 |
| WO | 2021/212333 A1 | 10/2021 |

OTHER PUBLICATIONS

Extended European Search Report of application No. 21965268.2 dated Jul. 5, 2024.
International Search Report from PCT/CN2022/088548 dated Aug. 9, 2022.
Written Opinion from PCT/CN2022/088548 dated Aug. 9, 2022.
International Search Report from PCT/CN2021/133886 dated May 9, 2022.
Written Opinion from PCT/CN2021/133886 dated May 9, 2022.
International Search Report from PCT/CN2022/096228 dated Sep. 2, 2022.
Written Opinion from PCT/CN2022/096228 dated Sep. 2, 2022.
International Search Report from PCT/CN2022/130372 dated Jan. 17, 2023.
Written Opinion from PCT/CN2022/130372 dated Jan. 17, 2023.
Non-final Office Action of U.S. Appl. No. 18/257,593 dated Dec. 2, 2025.
First Office Action of EP application No. 21965268.2 dated Aug. 25, 2025.
Non-final Office Action of U.S. Appl. No. 18/026,365 dated Oct. 31, 2025.
Non-final Office Action of U.S. Appl. No. 18/257,593 dated Mar. 18, 2026.
Final Office Action of U.S. Appl. No. 18/257,593 dated Mar. 18, 2026.

\* cited by examiner

DISPLAY PANEL AND DISPLAY DEVICE

CROSS-REFERENCE

The present application is the 371 application of PCT Application No. PCT/CN2022/130372, filed on Nov. 7, 2022, which is based upon and claims the priority to PCT International Application No. PCT/CN2021/133886, entitled "Display Substrate", filed on Nov. 29, 2021, the entire contents of which are hereby incorporated by reference.

TECHNICAL FIELD

The present disclosure relates to the field of display technologies, and in particular, to a display panel and a display device.

BACKGROUND

With the development of display technologies, display panels have been widely used in various electronic devices such as mobile phones to realize image display and touch operation. The OLED (Organic Light-Emitting Diode) display panel is a relatively common one of them.

It should be noted that the information disclosed in the Background section above is only for enhancing the understanding of the background of the present disclosure, and thus may include information that does not constitute prior art known to those of ordinary skill in the art.

SUMMARY

The present disclosure provides a display panel and a display device.

According to an aspect of the present disclosure, there is provided a display panel, including:

a driving backplane;

a plurality of first electrodes distributed in an array on a side of the driving backplane;

a pixel definition layer, disposed on a same side of the driving backplane as the first electrode, and provided with a pixel opening exposing each of the first electrodes and a separation slot between two adjacent pixel openings, wherein a boundary of the pixel opening is located within a boundary of a first electrode exposed by the pixel opening; a sidewall of the pixel opening is provided with a first cut-off slot, and a sidewall of the separation slot is provided with a second cut-off slot; and the first cut-off slot is at least partially located on a side of the second cut-off slot away from the driving backplane;

a light-emitting layer by which the pixel definition layer and the first electrodes are covered; and a second electrode, by which the light-emitting layer is covered.

According to an aspect of the present disclosure, there is provided a display device and includes the display panel according to any one of the above embodiments.

It should be noted that the above general description and the following detailed description are merely exemplary and explanatory and should not be construed as limiting of the disclosure.

BRIEF DESCRIPTION OF THE DRAWINGS

The accompanying drawings, which are incorporated in and constitute a part of this specification, illustrate embodiments consistent with the disclosure and together with the description serve to explain the principles of the disclosure. Apparently, the drawings in the following description are only some embodiments of the present disclosure, and those skilled in the art can obtain other drawings according to these drawings without creative efforts.

DETAILED DESCRIPTION

Figure 1:
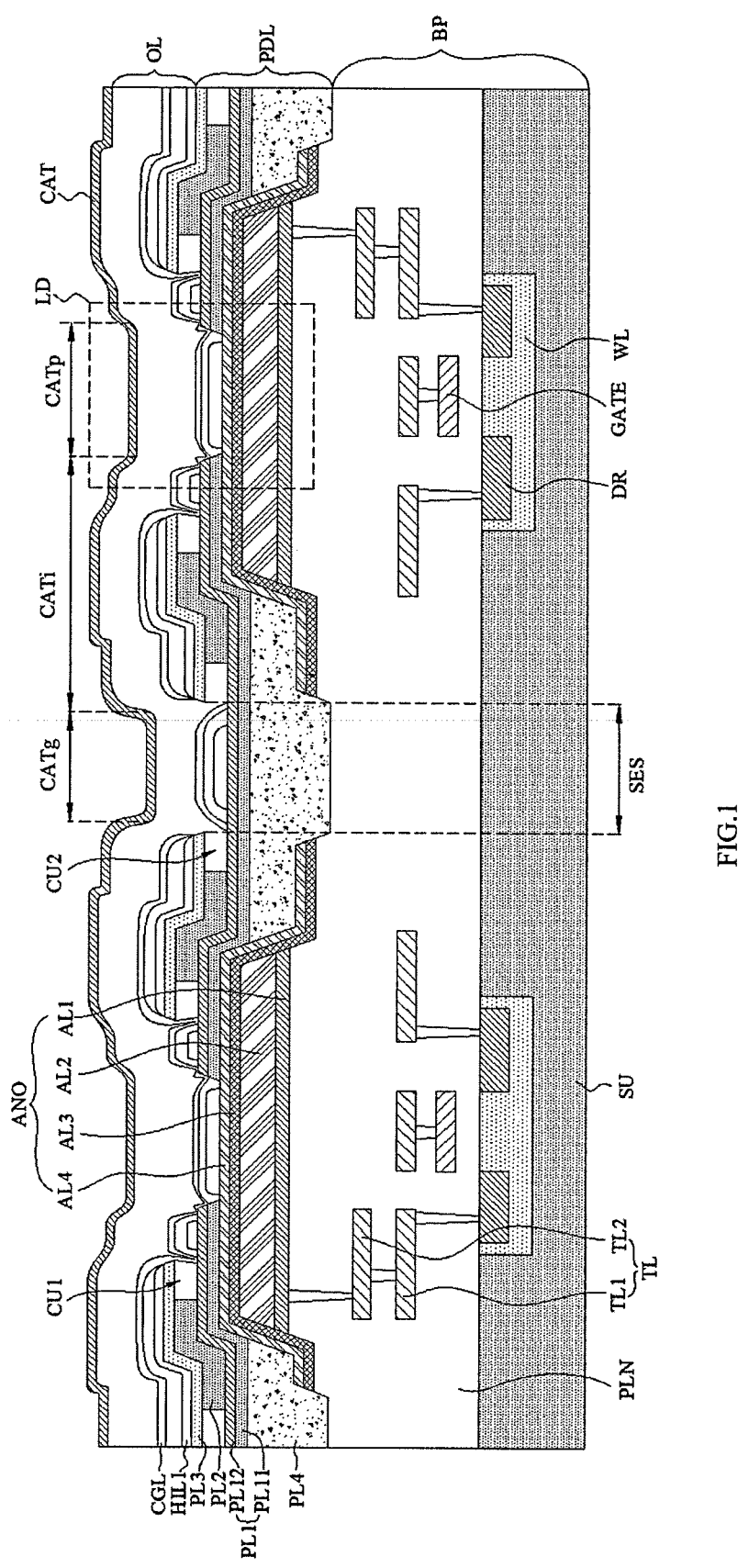
FIG. 1 is a partial cross-sectional view of a display panel according to an embodiment of the present disclosure.

Example embodiments will now be described more fully with reference to the accompanying drawings. However, exemplary embodiments may be implemented in many forms and should not be construed as limited to the embodiments set forth herein. Instead, these embodiments are provided so that the present disclosure will be thorough and complete, and will fully convey the concept of the exemplary embodiments to those skilled in the art. The same reference numerals in the drawings denote the same or similar structures, and thus their detailed descriptions will be omitted. In addition, the drawings are only schematic representations of the present disclosure and, thus, are not necessarily drawn to scale.

The terms "a", "an", "the", "said" and "at least one" are used to indicate the presence of one or more elements/components and the like; the terms "including/comprising" and "have" are used to indicate a nonexclusive meaning and refer to that there may be additional elements/components and the like in addition to the listed elements/components and the like. The terms "first", "second", "third" and the like are only used as a marker, not a limit on the number of objects related thereto.

Any "slope surface" in the present disclosure represents a straight line in a section perpendicular to a driving backplane, and a slope (e.g., α and β in FIG. 5) of the "slope surface" may be defined as an included angle, among included angles between such straight line or its extended line and a surface where the slope is located, close to the first electrode surrounded by the slope. It should be noted that, taking into account the influence of process errors, the above-mentioned straight line may not be an absolute straight line, but may be a curve extending roughly along a straight line. There may be multiple tangent lines to the curve, each tangent line may form an included angle with the surface where the slope is located, and the slope of the curve may be the largest included angle among the included angles, or an average value of the included angles.

In the related arts, a silicon-based OLED display panel includes a driving backplane and a light-emitting functional layer, where the light-emitting functional layer is provided on a side of the driving backplane and includes a plurality of light-emitting units. The light-emitting unit may include a first electrode (anode), a light-emitting layer, and a second electrode (cathode) stacked in sequence in a direction away from the driving backplane. The light-emitting layer may be driven to emit light by applying electrical signal on the first and second electrodes, while the specific light-emitting principle of the light-emitting device will not be described in detail here.

In addition, the light-emitting layer of each light-emitting unit may be directly evaporated through FMM (fine metal mask). The light-emitting layers of respective light-emitting units are distributed at intervals to emit light independently, thereby realizing color display. However, due to the limitation of FMM manufacturing process, it is difficult to achieve high PPI (pixels per inch). Therefore, color display may also be realized by combining monochromatic light or white light with color film. Specifically, each light-emitting unit shares an identical and continuous light-emitting layer, which may emit white light or other monochromatic light. The color film layer is provided with filter units corresponding to the light-emitting units one by one, where a sub-pixel may be formed by one filter unit and a corresponding light-emitting unit, and a pixel is constituted by a plurality of sub-pixels. Different colors of light can pass through different filter units, so that different sub-pixels may emit different colors of light. A single pixel includes multiple sub-pixels with different colors. For example, one pixel may include three sub-pixels whose luminescent colors are red, green and blue, respectively. In this way, color display can be realized by a plurality of pixels.

However, if the light-emitting layer is in a structure of continuous and complete layer, electric leakage may be likely to occur between one light-emitting unit and surrounding light-emitting units, resulting in cross-color. Each light-emitting unit may include a plurality of light-emitting devices connected in series, and respective light-emitting devices of the same light-emitting unit share the first electrode and the second electrode. There are a plurality of light-emitting sub-layers between the first electrode and the second electrode, and at least two adjacent light-emitting sub-layers may be connected in series through a charge generation layer. For example, when the light-emitting units corresponding to the red filter in the color film layer emits light, due to the influence of leakage, the light-emitting units corresponding to the green filter in the color film layer may also emit light, which reduces the purity of light emitted by a single pixel, decreasing the color gamut of the whole display panel.

Embodiments of the present disclosure provide a display panel. As shown in FIG. 1, the display panel may include a driving backplane BP, a first electrode ANO, a pixel definition layer PDL, a light-emitting layer OL, and a second electrode CAT.

The first electrode ANO is disposed on a side of the driving backplane BP, and the number of first electrodes ANO is more than one, which are distributed at intervals. The pixel definition layer PDL is disposed on the same side of the driving backplane BP as the first electrode ANO. The pixel definition layer PDL is provided with a pixel opening PH exposing each first electrode ANO, and a boundary of the pixel opening PH is located within a boundary of a first electrode ANO exposed by the pixel opening PH. Furthermore, the pixel definition layer PDL is further provided with a separation slot SES separating respective pixel openings PH. A sidewall of the pixel opening PH is provided with a first cut-off slot CU1, and a sidewall of the separation slot SES is provided with a second cut-off slot CU2. The first cut-off slot CU1 is at least partially located on a side of the second cut-off slot CU2 away from the driving backplane BP. The light-emitting layer OL covers the pixel definition layer PDL and the first electrode ANO. The second electrode CAT covers the light-emitting layer OL.

According to the display panel in embodiments of the present disclosure, any first electrode ANO and its corresponding light-emitting layer OL and second electrode CAT can constitute a light-emitting unit LD, and the pixel definition layer PDL can separate individual light-emitting units LD to define a range of each light-emitting unit LD. Furthermore, due to the existence of the first cut-off slot CU1 and the second cut-off slot CU2, at least part of film layers of the light-emitting layer OL can be disconnected at the first cut-off slot CU1 and the second cut-off slot CU2, thereby reducing the risk of mutual leakage between adjacent light-emitting units LD and improving the cross-color.

Since the first cut-off slot CU1 is at least partially located on the side of the second cut-off slot CU2 away from the driving backplane BP, the first cut-off slot CU1 is at least partially higher than the second cut-off slot CU2. The second cut-off slot CU2 can cut off a film layer in the light-emitting layer OL that is closer to the driving backplane BP, and the first cut-off slot CU1 can cut off a film layer in the light-emitting layer OL that is farther away from the driving backplane BP, in addition to the film layer in the light-emitting layer OL that is closer to the driving backplane BP. In this way, the risk of mutual leakage between adjacent light-emitting units LD can be further reduced by means of the first cut-off slot CU1 and the second cut-off slot CU2, improving the cross-color.

In addition, since the film layer in the light-emitting layer OL that is farther away from the driving backplane BP can be cut off by the first cut-off slot CU2 farther to the driving backplane BP, without increasing a thickness of the pixel definition layer PDL and widths of the first cut-off slot CU1 and the second cut-off slot CU2, which avoids a puncture phenomenon caused by a sharp drop of the second electrode CAT at sidewalls of the pixel opening PH and the separation slot SES due to the increase in the thickness and the width, so as to avoid a problem of an excessive voltage drop of the second electrode CAT caused by the puncture phenomenon.

The structure for realizing the display function of the display panel according to the present disclosure will be described in detail below.

The display panel may include a display area and a peripheral area, where the peripheral area is located outside the display area and may be arranged around the display area. The driving backplane BP is used to form a driving circuit for driving the light-emitting unit LD to emit light, and the driving circuit may include a pixel circuit and a peripheral circuit.

In some embodiments, the number of both the pixel circuit and the light-emitting unit LD may be more than one, and at least a part of the pixel circuits is located within the display area. The pixel circuit may be formed in a pixel circuit of 2T1C, 4T1C and the like, as long as it can drive the light-emitting unit LD to emit light, which will not be specially limited here. The pixel circuits have a same number as the first electrodes ANO, and is connected to the first electrodes ANO in a one-to-one correspondence, so as to respectively control each light-emitting unit LD to emit light. Herein, nTmC indicates that the pixel circuit includes n transistors (indicated by the letter "T") and m capacitors (indicated by the letter "C"). In some embodiments, multiple light-emitting units LD may be driven by a single pixel circuit.

The peripheral circuit is located in the peripheral area and connected with the pixel circuit. The peripheral circuit may include a light emission control circuit, a gate driving circuit, a source driving circuit, etc., and may also include a power supply circuit connected to the second electrode CAT for inputting a power supply signal to the second electrode CAT. The peripheral circuit may enable the light-emitting unit LD to emit light by inputting signals to the first electrode ANO and the second electrode CAT through the pixel circuits.

In some embodiments of the present disclosure, as shown in FIG. 1, the driving backplane BP may include a substrate SU, which may be a silicon substrate. The above-mentioned driving circuit may be formed on the silicon substrate through the semiconductor process. For example, both the pixel circuit and the peripheral circuit may include a plurality of transistors, and a well region WL may be formed in the silicon substrate through a doping process, where the well region WL is provided with two doped regions DR distributed at intervals. Take one well region WL as an example, a gate GATE is provided on a side of the driving backplane BP, with an orthographic projection of the gate GATE on the driving backplane BP is located between the two doped regions DR; a transistor may be formed by the well region WL and the gate GATE, with the doped regions DR of the well region WL serving as the first electrode and the second electrode of the transistor, respectively, and the well region WL between the two doped regions DR serving as the channel region of the transistor.

The driving backplane BP may also include at least one trace layer TL and a planarization layer PLN, where the trace layer TL is provided on one side of the substrate SU, the planarization layer PLN covers the trace layer TL, and at least one trace layer TL is connected with each doped region DR.

For example, as shown in FIG. 1, the number of trace layers TL is two, which are located within the planarization layer PLN. For example, the trace layers TL include a first trace layer TL1 and a second trace layer TL2, where the first trace layer TL1 is provided on one side of the substrate SU, and a part of the planarization layer PLN is provided between the first trace layer TL1 and the substrate SU. The second trace layer TL2 is provided on one side of the first trace layer TL1 away from the substrate SU, and is separated from the first trace layer TL1 by a part of the planarization layer PLN, and at least a partial region of the second trace layer TL2 is connected with the first trace layer TL1.

Each trace layer TL may be formed by a sputtering process. The planarization layer PLN may be formed of materials including silicon oxide, silicon oxynitride or silicon nitride, and formed layer by layer through multiple deposition and polishing processes. In other words, the planarization layer PLN may be formed by stacking multiple insulating film layers.

As shown in FIG. 1, the light-emitting units LD are distributed in array on a side of the driving backplane BP, for example, on a surface of the planarization layer PLN away from the substrate SU. Each light-emitting unit LD may include a first electrode ANO, a second electrode CAT, and a light-emitting layer OL between the first electrode ANO and the second electrode CAT. The first electrode ANO and the second electrode CAT may both be connected to the trace layer TL. The light-emitting layer OL may be driven to emit light by applying a driving signal to the first electrode ANO and applying a power signal to the second electrode CAT through the driving backplane BP.

In order to realize color display, each light-emitting unit LD may emit light of the same color and realize color display by cooperating with the color film layer located on one side of the second electrode CAT away from the driving backplane BP. Embodiments of the present disclosure is described by taking such solution of color display as an example.

In some embodiments of the present disclosure, as shown in FIG. 1, a plurality of light-emitting units LD may be formed by the first electrode ANO, the pixel definition layer PDL, the light-emitting layer OL and the second electrode CAT.

In some embodiments, the first electrode ANO is disposed on the side of the driving backplane BP, for example, on the surface of the planarization layer PLN away from the substrate SU. Each first electrode ANO is located in the display area. The first electrodes ANO are connected to the pixel circuit, with each first electrode ANO being connected to one pixel circuit.

Figure 3:
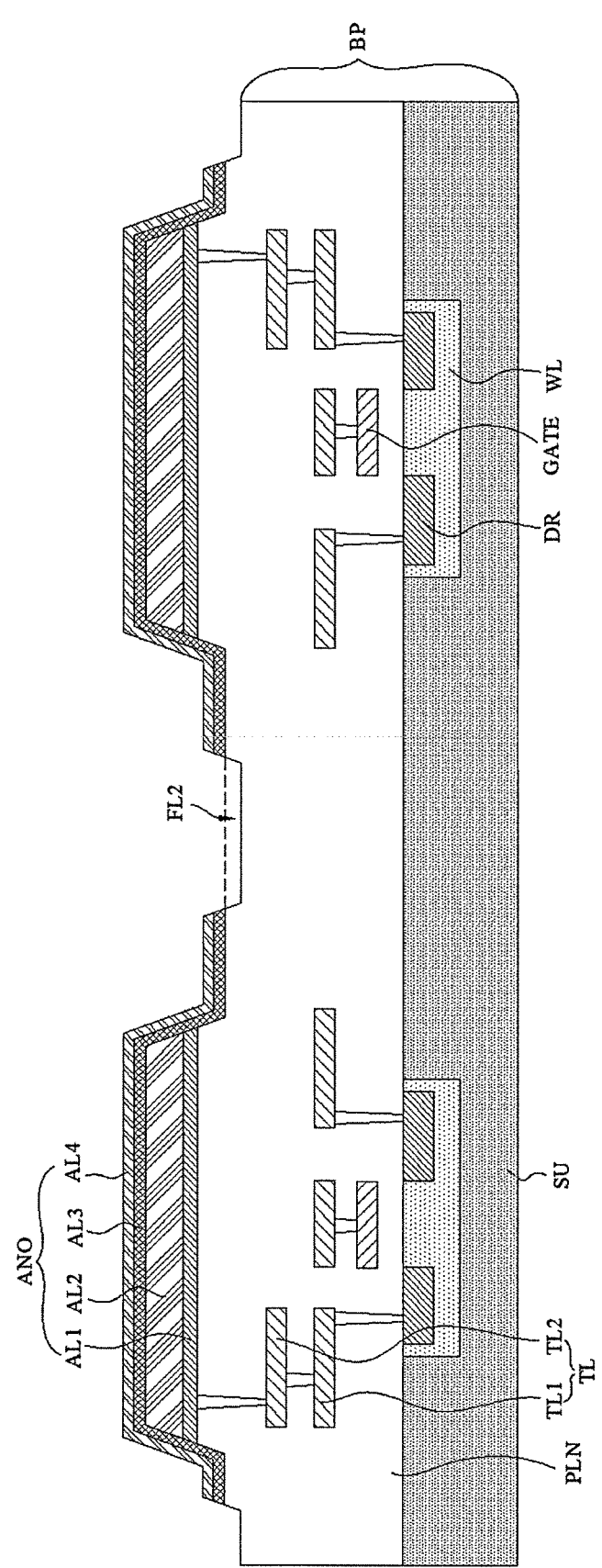
FIG. 3 is a partial cross-sectional view of a driving backplane and a first electrode of a display panel according to an embodiment of the present disclosure.

The first electrode ANO may be a single-layer or multi-layer structure, and its material is not particularly limited here. As shown in FIGS. 1 and 3, in some embodiments of the present disclosure, the first electrode ANO may include a first conductive layer AL1, a second conductive layer AL2 and a first conductive protective layer AL3.

In some embodiments, the first conductive layer AL1 is disposed on the backplane BP, for example, on the surface of the planarization layer PLN away from the substrate SU. A material of the first conductive layer AL1 is a conductive material such as a metal or a metal oxide, for example, titanium, titanium nitride and the like. The second conductive layer AL2 is disposed on a surface of the first conductive layer AL1 away from the driving backplane BP, and its material has a lower resistivity than the first conductive layer AL1. The material of the second conductive layer AL2 may be the conductive material, for example, the metal such as aluminum and silver, or the metal oxide.

As shown in FIGS. 1 and 3, the first conductive protection layer AL3 covers a surface of the second conductive layer AL2 away from the driving backplane BP, and also covers sidewalls of the second conductive layer AL2 and the first conductive layer AL1. That is to say, the first conductive protective layer AL3 extends from the surface of the second conductive layer AL2 away from the driving backplane BP onto the driving backplane BP, thereby cladding the entirety formed by the first conductive layer AL1 and the second conductive layer AL2 to prevent the corrosion or other damage to the second conductive layer AL2 by the subsequent processes. The first conductive protection layer AL3 may be made of the metal or the metal oxide, for example, the conductive material such as titanium, titanium nitride. The material of the first conductive protection layer AL3 may be the same as or may be different from that of the first conductive layer AL1.

Further, as shown in FIGS. 1 and 3, the first electrode ANO may further include a second conductive protective layer AL4, which can cover the first conductive protective layer AL3. The second conductive protective layer AL4 may be made of a transparent conductive material such as indium tin oxide (ITO), which may further prevent the corrosion or other damage to the second conductive layer AL2 by the subsequent processes.

Figure 4:
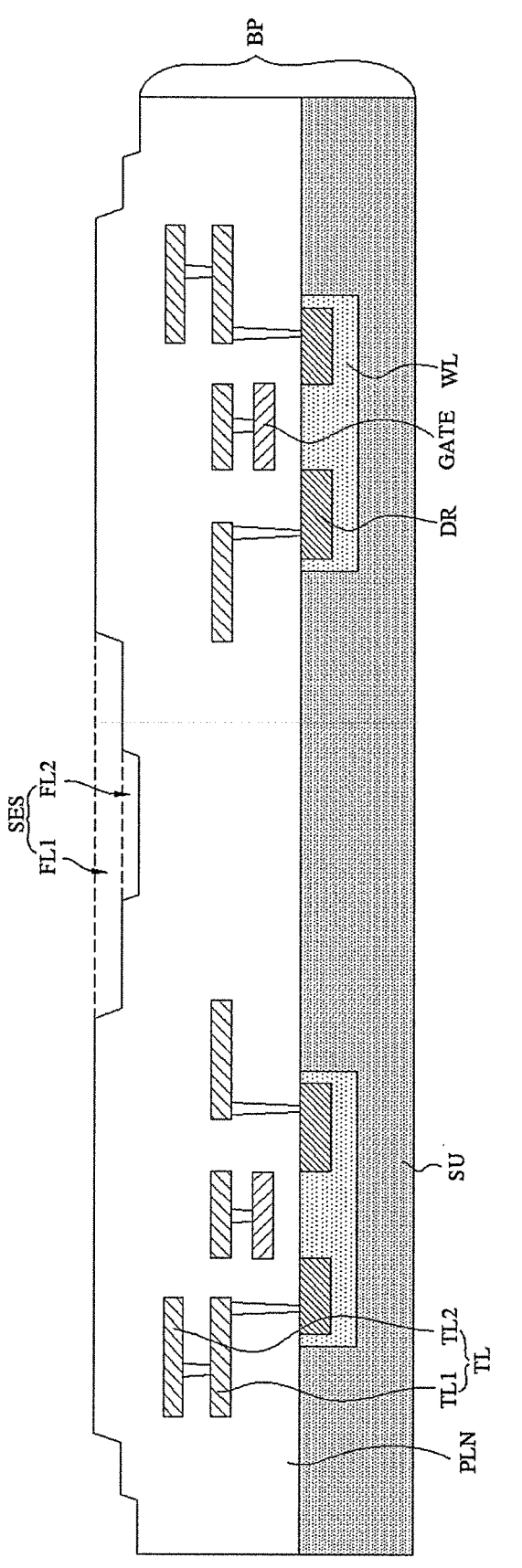
FIG. 4 is a partial cross-sectional view of a driving backplane of a display panel according to an embodiment of the present disclosure.

As shown in FIG. 1, FIG. 3 and FIG. 4, when the first conductive layer AL1 to the second conductive protective layer AL4 of the first electrode ANO are formed, the first conductive layer AL1 and the second conductive layer AL2 may be sequentially formed on the driving backplane BP by a photolithography process. During this process, due to the etching of the first conductive layer AL1 and the second conductive layer AL2, a first groove FL1 may be formed on the driving backplane BP, for example, on the planarization layer PLN. After the second conductive layer AL2 is formed, the first conductive protective layer AL3 and the second conductive protective layer AL4 may be sequentially formed by the photolithography process. During this process, due to the etching of the first conductive protective layer AL3 and the second conductive protective layer AL4, a bottom of the first groove FL1 may be further etched to form a second groove FL2, so as to realize the patterning of the first conductive protective layer AL3 and the second conductive protective layer AL4, and form the first electrodes ANO distributed at intervals. The second groove FL2 is smaller than a bottom surface of the first groove FL1, and both the first conductive protective layer AL3 and the second conductive protective layer AL4 extend to an area of the bottom surface of the first groove FL1 where the second groove FL2 is not provided, mainly to ensure that the first conductive protective layer AL3 and the second conductive protective layer AL4 can cover the sidewall of the second conductive layer AL2.

Figure 2:
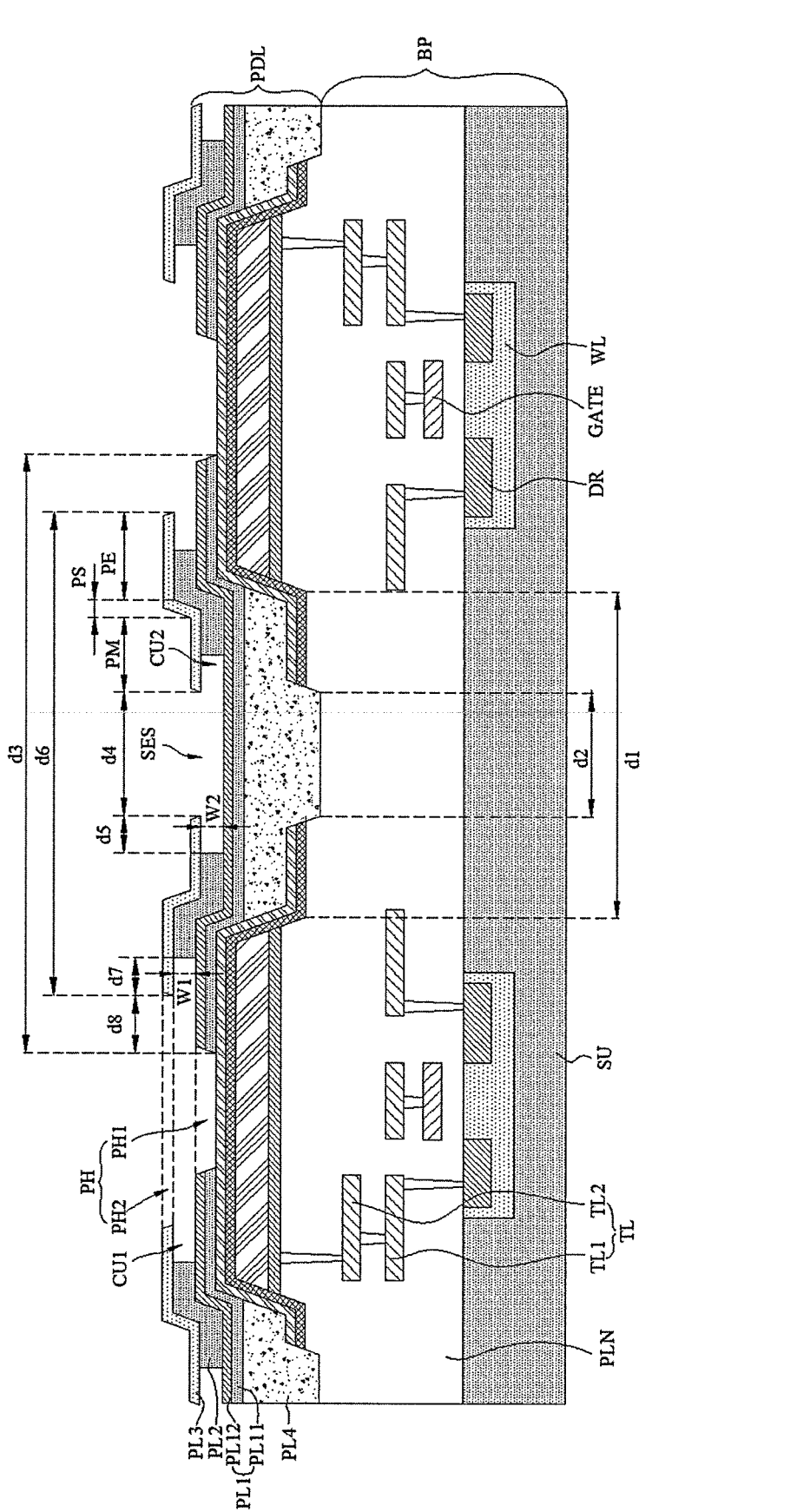
FIG. 2 is a partial cross-sectional view of a driving backplane, a first electrode and a pixel definition layer of a display panel according to an embodiment of the present disclosure.

In some embodiments of the present disclosure, as shown in FIG. 2 and FIG. 4, a width d1 of the first groove FL1 is not smaller than 0.5 μm and not greater than 1.2 μm, for example, the width d1 of the first groove FL1 may be 0.5 μm, 0.8 μm, 1.1 μm, 1.2 μm, etc.

As shown in FIG. 2 and FIG. 4, a width d2 of the second groove FL2 is not smaller than 0.2 μm and not greater than 0.9 μm, for example, the width d2 of the second groove FL2 may be 0.2 μm, 0.5 μm, 0.8 μm, 0.9 μm, etc.

A width d4 of the separation slot SES may be equal to the width d2 of the second groove FL2, and correspondingly, the width d4 of the separation slot SES may also be not smaller than 0.2 μm and not greater than 0.9 μm.

In some embodiments of the present disclosure, the first electrode ANO may only include the first conductive layer AL1, the second conductive layer AL2, and the first conductive protective layer AL3. A corrosion-resistance degree of the first conductive protective layer AL3 is higher than that of the conductive material of the second conductive layer AL2. For example, the material of the second conductive layer AL2 is aluminum, and the material of the first conductive protective layer AL3 is indium tin oxide.

In some embodiments of the present disclosure, the first electrode ANO may include the first conductive layer AL1 to the second conductive protection layer AL4, but the second conductive protection layer AL4 may be stacked on the surface of the second conductive layer AL2 away from the driving backplane BP, without covering the sidewalls of the second conductive layer AL2 and the first conductive layer AL1.

As shown in FIGS. 1 and 2, the pixel definition layer PDL and the first electrode ANO are disposed on the same surface of the driving backplane BP, for example, the pixel definition layer PDL is located on the surface of the planarization layer PLN away from the substrate SU. The pixel definition layer PDL exposes each first electrode ANO. Specifically, the pixel definition layer PDL may be provided with a plurality of pixel openings PH exposing respective first electrodes ANO.

An orthographic projection of any pixel opening PH on the driving backplane BP may be located within an orthographic projection on the driving backplane of a first electrode ANO exposed by this pixel opening PH. In other words, the pixel opening PH is not larger than the first electrode ANO exposed by it. For example, a boundary of the pixel opening PH is located inside a boundary of the first electrode ANO exposed by it, that is, an area of the pixel opening PH is smaller than an area of the first electrode ANO exposed by it, so that the pixel definition layer PDL covers an edge of the first electrode ANO.

Figure 13:
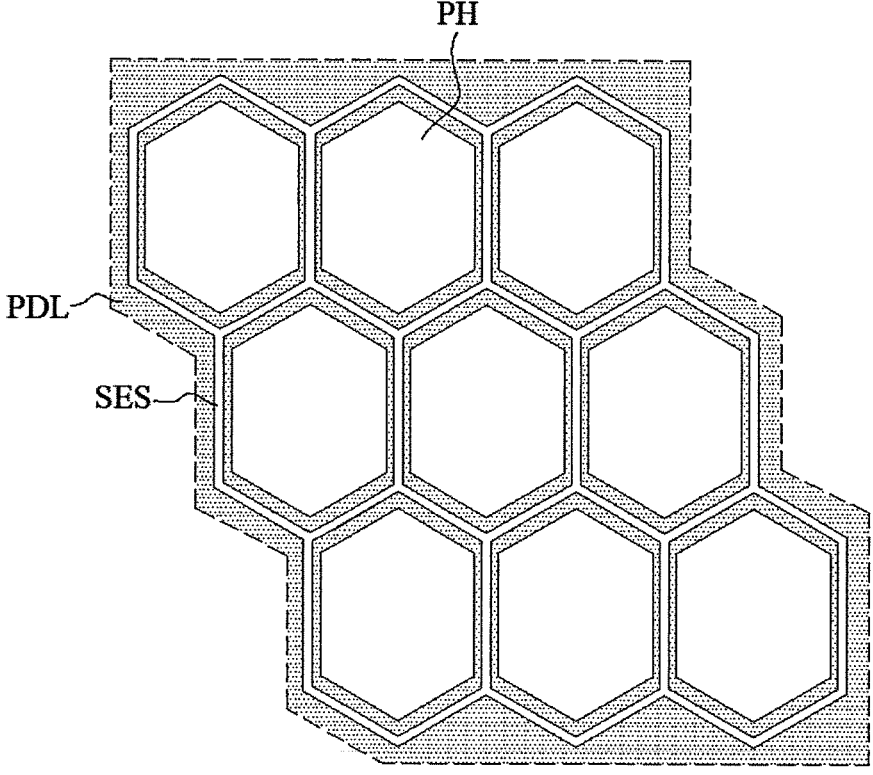
FIG. 13 is a partial top view of a display panel according to an embodiment of the present disclosure.

As shown in FIG. 13, a shape of the pixel opening PH may be a polygon such as rectangle, pentagon, hexagon, but not necessarily a regular polygon. The pixel opening PH may also be in other shapes, such as an ellipse and the like, which are not particularly limited here.

As shown in FIG. 1, the light-emitting layer OL covers the pixel definition layer PDL and the first electrode ANO, and the area where the light-emitting layer OL and the first electrode ANO are stacked is used to form a light-emitting unit LD. In other words, respective light-emitting units LD may share the same light-emitting layer OL, and the parts of the light-emitting layer OL that are stacked on different first electrodes ANO belong to different lighting units SUP. In addition, 20, since respective light-emitting units LD share the light-emitting layer OL, different light-emitting units LD can emit light of the same color.

Figure 11:
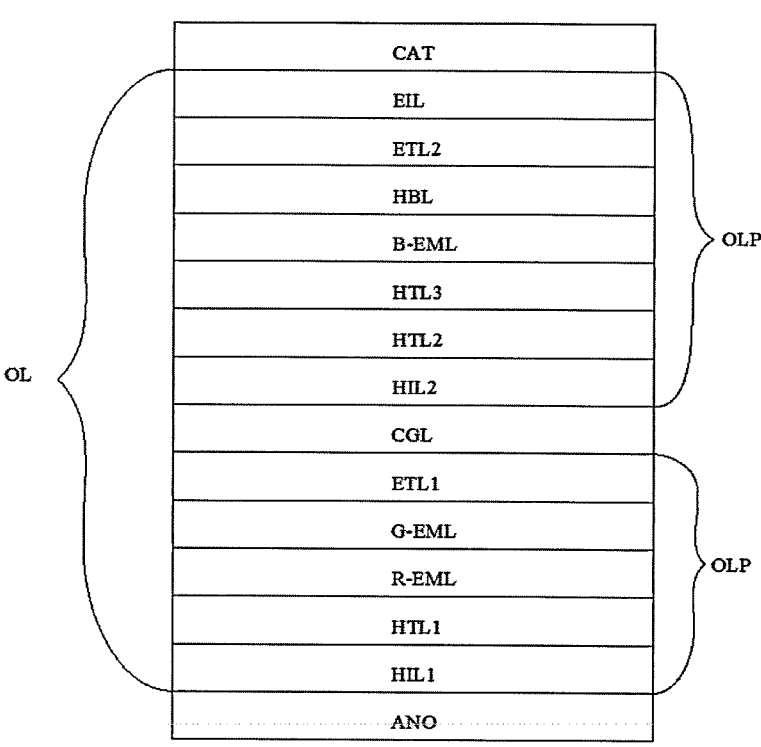
FIG. 11 is a schematic diagram of a light-emitting unit with two light-emitting sub-layers in a display panel according to an embodiment of the present disclosure.
Figure 12:
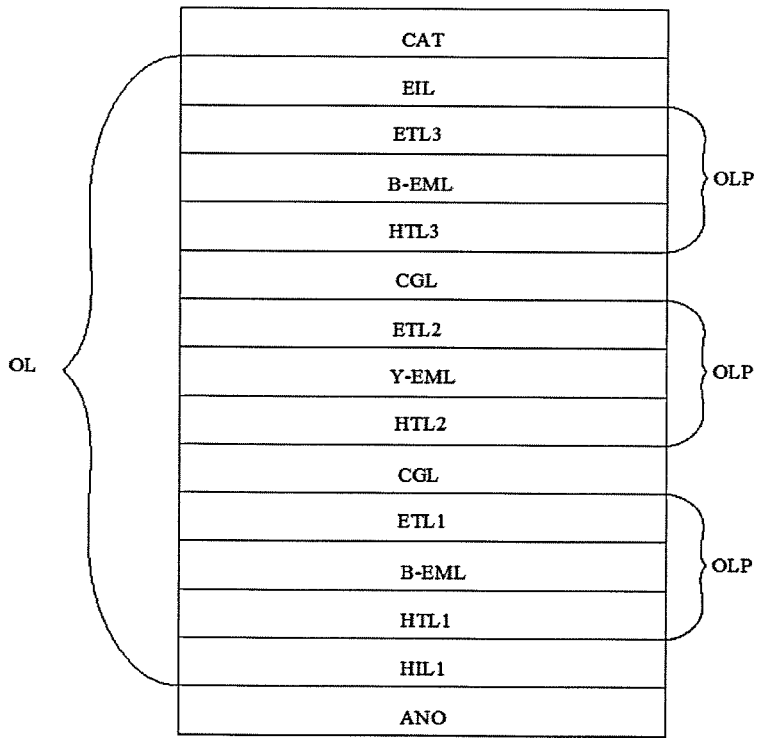
FIG. 12 is a schematic diagram of a light-emitting unit with three light-emitting sub-layers in a display panel according to an embodiment of the present disclosure.

In some embodiments of the present disclosure, as shown in FIG. 1, FIG. 11 and FIG. 12, the light-emitting unit LD may include a plurality of light-emitting devices LD connected in series. Each light-emitting unit LD includes a first electrode ANO, a second electrode CAT and a plurality of light-emitting sub-layers OLP between the first electrode ANO and the second electrode CAT. Respective light-emitting devices LD of the same light-emitting unit LD may share the same first electrode ANO and the same second electrode CAT, that is, the same light-emitting unit LD may have only one first electrode ANO and one second electrode CAT.

For example, as shown in FIG. 1, FIG. 11 and FIG. 12, the light-emitting layer OL may include a hole injection layer HIL1, a plurality of light-emitting sub-layers OLP and an electron injection layer EIL. The light-emitting sub-layers OLP are disposed between the hole injection layer HIL1 and the electron injection layer EIL, and are coupled in series in a direction away from the driving backplane BP, where two adjacent light-emitting sub-layers OLP may be coupled in series through a charge generation layer CGL located between them. When the electric signal is applied to the first electrode ANO and the second electrode CAT, each light-emitting sub-layer OLP can emit light, and different light-emitting sub-layers OLP can be used to emit light of different colors.

Furthermore, as shown in FIGS. 11 and 12, any light-emitting sub-layer OLP may at least include a hole transport layer HTL, a light-emitting material layer EML and an electron transport layer ETL distributed in the direction away from the driving backplane BP. The specific luminescence principle will not be described in detail here.

In some embodiments, the numbers of the hole injection layer HIL, hole transport layer HTL, electron transport layer ETL and electron injection layer EIL are not particularly limited here, and adjacent light-emitting sub-layers OLP may share one or more of the hole injection layer HIL, hole transport layer HTL, electron transport layer ETL and electron injection layer EIL. Moreover, the charge generation layer CGL may be provided between at least two adjacent light-emitting sub-layers OLP, so that the two light-emitting sub-layers OLP are connected in series.

In some embodiments of the present disclosure, as shown in FIG. 11, the light-emitting layer OL may include two light-emitting sub-layers OLP with different colors, that is, a first light-emitting sub-layer that emits both red and green light and a second light-emitting sub-layer that emits blue light. The first light-emitting sub-layer and the second light-emitting sub-layer can emit light at the same time, so that the light-emitting layer OL emits white light. The first light-emitting sub-layer has two light-emitting material layers EML, that is, a light-emitting material layer R-EML that emits the red light, and a light-emitting material layer G-EML that emits the green light. Specifically, the first light-emitting sub-layer may include a hole transport layer HTL1, a light-emitting material layer R-EML, a light-emitting material layer G-EML, and an electron transport layer ETL2 stacked on the hole injection layer HIL1 in sequence in the direction away from the driving backplane BP.

A charge generation layer CGL may be disposed on a surface of the first light-emitting sub-layer away from the driving backplane BP, and the second light-emitting sub-layer is disposed on a surface of the charge generation layer CGL away from the driving backplane BP, so that the first light-emitting sub-layer and the second light-emitting sub-layer are connected in series. The second light-emitting sub-layer includes a hole injection layer HIL2, a hole transport layer HTL2, a hole transport layer HTL3, a light-emitting material layer B-EML that emits the blue light, a hole barrier layer HBL, and an electron transport layer ETL sequentially stacked, in the direction away from the driving backplane BP, on a side of the charge generation layer CGL away from the driving backplane BP. An electron injection layer EIL is disposed on a surface of the electron transport layer ETL2 away from the driving backplane BP. The second electrode CAT is disposed on a surface of the electron injection layer EIL away from the driving backplane BP.

In some other embodiments of the present disclosure, as shown in FIG. 12, the number of light-emitting sub-layers OLP may be three, and these light-emitting sub-layers OLP are stacked between the hole injection layer HIL1 and the electron injection layer EIL in the direction away from the driving backplane BP. Each light-emitting sub-layer OLP may only include the hole transport layer HTL, the light-emitting material layer EML and the electron transport layer ETL stacked in the direction away from the driving backplane BP.

The light-emitting material layers EML of the three light-emitting sub-layers OPL may include two light-emitting material layers B-EML that emit the blue light and one light-emitting material layer Y-EML that emits the yellow light. The color display may also be realized by selecting the color and material of the filter unit of the color film layer.

The three light-emitting sub-layers OLP are respectively a first light-emitting sub-layer, a second light-emitting sub-layer and a third light-emitting sub-layer, and the first light-emitting sub-layer, the second light-emitting sub-layer and the third light-emitting sub-layer are distributed sequentially in the direction away from the driving backplane BP.

In some embodiments, the first light-emitting sub-layer includes a hole transport layer HTL1, a light-emitting material layer B-EML, and an electron transport layer ETL1. The second light-emitting sub-layer includes a hole transport layer HTL2, a light-emitting material layer Y-EML, and an electron transport layer ETL2. The third light-emitting sub-layer includes a hole transport layer HTL3, a light-emitting material layer B-EML, and an electron transport layer ETL3.

The number of charge generation layers CGL is two, and one charge generation layer CGL is disposed between two adjacent light-emitting sub-layers OLP. That is, one charge generation layer CGL is disposed between the first light-emitting sub-layer and the second light-emitting sub-layer, and the other charge generation layer CGL is disposed between the second light-emitting sub-layer and the third light-emitting sub-layer.

Alternatively, in other embodiments of the present disclosure, the light-emitting material layers EML of the three light-emitting sub-layers OPL may emit the red light, the blue light and the green light, respectively, and the colors are not specifically limited here.

Figure 6:
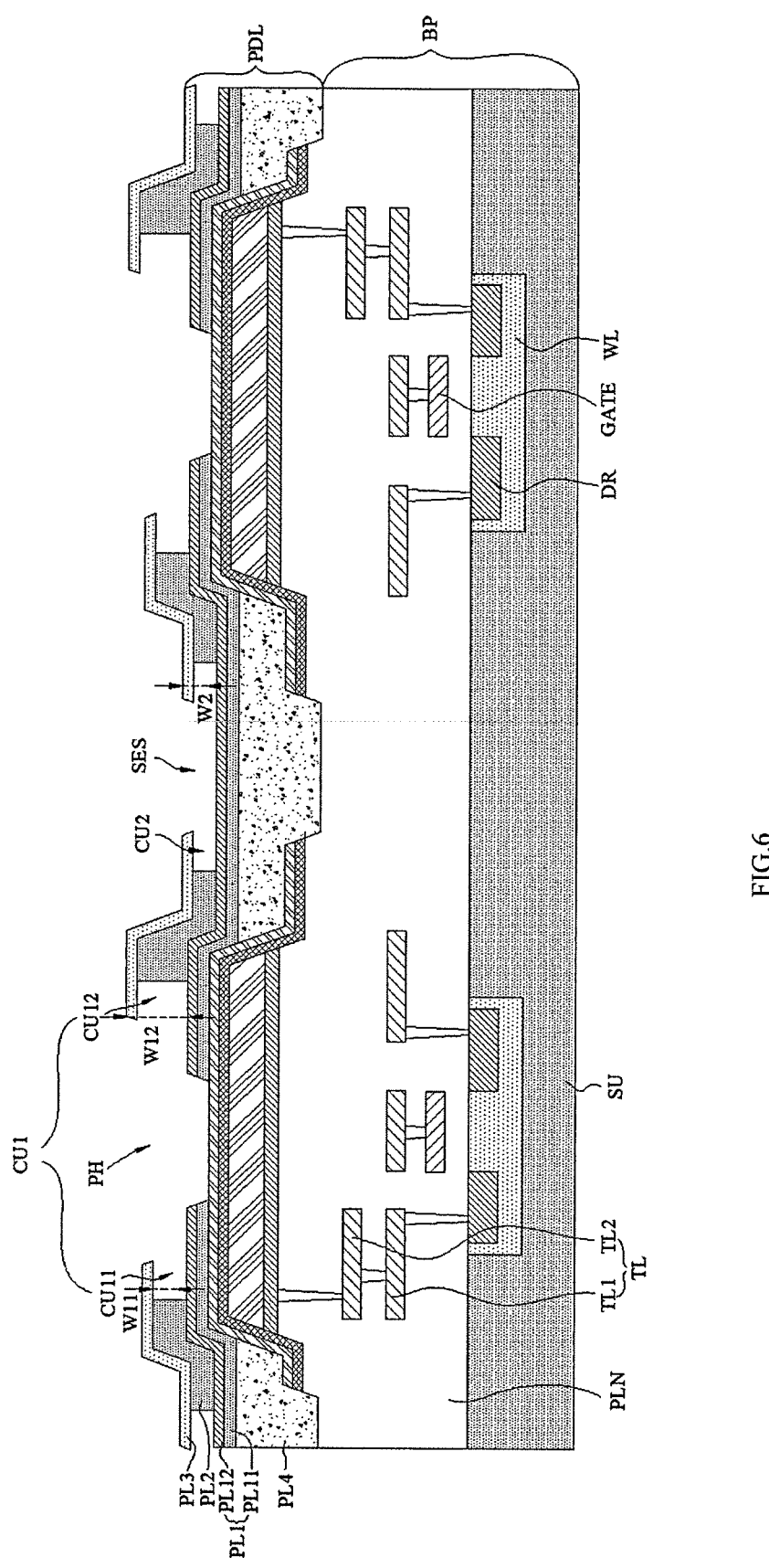
FIG. 6 is a partial cross-sectional view of a display panel according to an embodiment of the present disclosure.

In some embodiments of the present disclosure, it is aimed at the case of three light-emitting sub-layers OLP. In two first cut-off slots CU1 with different widths of the same pixel opening PH, a width difference between the two first cut-off slots CU1 is 0.8 to 1.2 times a width difference between one of the first cut-off slots CU1 and the second cut-off slot CU2. For example, as shown in FIG. 6, the width difference between the first cut-off slot CU11 and the second cut-off slot CU2 is a first width difference, the width difference between the first cut-off slot CU12 and the first cut-off slot CU11 is a second width difference, and the second width difference is 0.8 to 1.2 times the first width difference.

In addition, in some embodiments of the present disclosure, widths of second cut-off slots CU2 on two sidewalls of the separation slot SES may also be different. The second cut-off slots CU2 with different widths may be located on the same sidewall and distributed around the first electrode ANO, or may be in communication with each other, or may be staggered, so that the same sidewall may be provided with second cut-off slots CU2 with different widths. Alternatively, the second cut-off slots CU2 with the different widths may also be respectively located on two sidewalls of the separation groove SES, so that the widths of the cut-off slots CU2 on the same sidewall are the same.

The two charge generation layers CGL and the hole injection layer HIL1 in the scheme of three light-emitting sub-layers can be cut off by setting the second cut-off slot CU2 with a relatively large width, so as to improve the anti-crosstalk effect.

It should be noted that in the same display panel, there may be a plurality of first cut-off slots CU1 with different widths, and there may also be a plurality of second cut-off slots CU2 with different widths, as long as it can be ensured that the hole injection layer HIL1 and the charge generation layer CGL can be cut off to prevent the crosstalk. The matching arrangement of the first cut-off slot CU1 and the second cut-off slot CU2 with different widths can also play a role of reducing the risk of overlapping between the charge generation layer CGL and the first electrode ANO, which is conducive to ensuring the normal light emission of the light-emitting unit LD.

The structure of the light-emitting layer OL described above is only an example and does not constitute a limitation to its film layers, and the number of its light-emitting sub-layers OLP may be more, or only one light-emitting sub-layer OLP is included, as long as it can cooperate with the color film layer to realize color display.

As shown in FIG. 1, the second electrode CAT covers the light-emitting layer OL, and the orthographic projection of the second electrode CAT on the driving backplane BP may cover the display area and extend into the peripheral area. Respective light-emitting units LD may share the same second electrode CAT. Light emission of the light-emitting layer OL may be controlled by controlling the voltages of the power signal input to the second electrode CAT and the driving signal input to the first electrode ANO.

As shown in FIG. 1, the display panel may further include a color film layer, which may be disposed on the side of the second electrode CAT away from the driving backplane BP, and includes a plurality of filter units. Respective first electrodes ANO and filter units are arranged opposite to each other one by one in the direction perpendicular to the driving backplane BP. In other words, the orthographic projection of a filter unit on the driving backplane BP at least partially coincides with a first electrode ANO. Each filter includes filter of at least three colors, for example, a filter unit for passing red light, a filter unit for passing green light, and a filter unit for passing blue light. After the light emitted by each light-emitting unit LD is filtered by the filter unit, monochromatic light of different colors can be obtained, thereby realizing color display. In some embodiments, a sub-pixel may be constituted by a filter unit and its corresponding light-emitting unit LD, and the color of light emitted by any sub-pixel is the color of the light transmitted by its filter unit. A pixel may be constituted by a plurality of sub-pixels, and respective sub-pixels in the same pixel emit light of different colors.

The color film layer may further include a light-shielding portion for separating the filter units, the light-shielding portion is opaque and shields the area between two light-emitting units LD. The filter units may be arranged at intervals by using a light-shielding material directly. Alternatively, in some embodiments of the present disclosure, adjacent filter units may be stacked at the area corresponding to two adjacent light-emitting units LD, with the colors of the light transmitted by them being different, so that the stacked area is opaque.

In addition, in some embodiments of the present disclosure, on the basis that the light-emitting layer OL emits white light, in order to improve the brightness of the screen, the color film layer may further include a transparent portion. In the direction perpendicular to the substrate, the transparent portion may be provided opposite to the light-emitting unit LD, so that the color film layer can also directly transmit the light emitted by the light-emitting layer OL, such as the white light, thereby improving the brightness by the white light.

In order to improve the light extraction efficiency, a light extraction layer may be covered on the side of the second electrode CAT away from the driving backplane BP to improve brightness. Furthermore, the light extraction layer may directly cover the surface of the second electrode CAT away from the driving backplane BP.

In order to facilitate the connection of the second electrode CAT with the driving circuit, in some embodiments of the present disclosure, the first electrode layer FE further includes an adapter ring. The orthographic projection of the adapter ring on the driving backplane BP is located in the peripheral area. The adapter ring may be connected with the peripheral circuit, and surround the display area. The second electrode CAT may be connected with the adapter ring, so that the second electrode CAT can be connected with the peripheral circuit through the adapter ring, and the driving signal can be applied by the peripheral circuit to the second electrode CAT. The pattern of the adapter ring may be the same as that of the first electrode ANO in the display area, so as to improve the uniformity of pattern of the first electrode layer FE.

In some embodiments of the present disclosure, as shown in FIG. 1, the display panel of the present disclosure may further include an encapsulation layer, which may be disposed on the side of the second electrode CAT away from the driving backplane BP, located between the color film layer and the second electrode CAT, and used to block the erosion of external water and oxygen. The encapsulation layer may be a single-layer or multi-layer structure. For example, the encapsulation layer may include a first encapsulation sub-layer, a second encapsulation sub-layer, and a third encapsulation sub-layer stacked in sequence in the direction away from the driving backplane BP. In some embodiments, materials of the first encapsulation sub-layer and the second encapsulation sub-layer may be inorganic insulation materials such as silicon nitride and silicon oxide, and the second encapsulation sub-layer may be formed by the ALD (Atomic Layer Deposition) process; the material of the third encapsulation sub-layer may be an organic material, and it may be formed by the MLD (Molecular Layer Deposition) process. Alternatively, the encapsulation layer may also adopt other structures, and the structure of the encapsulation layer is not particularly limited here.

In addition, the display panel may also include the transparent cover, which may cover the side of the encapsulation layer away from the driving backplane BP. The transparent cover may be a single-layer or multi-layer structure, and its material is not specifically limited.

Based on the above analysis of the related arts, since respective light-emitting units LD share the light-emitting layer OL, the carriers (e.g., holes) of a light-emitting unit LD may move to other light-emitting units LD, especially to its adjacent light-emitting units LD, through the charge generation layer CGL, the hole injection layer close to the driving backplane BP or the like. In other words, electric leakage occurs, which may affect the purity of light emission and cause cross-color. Therefore, as shown in FIG. 1 and FIG. 2, the separation slot SES may be provided on the pixel definition layer PDL, the first cut-off slot CU1 is provided on the sidewall of the pixel opening PH, and the second cut-off slot CU2 is opened in the sidewall of the separation slot SES. The light-emitting layer OL is restricted by the first cut-off slot CU1 and the second cut-off slot CU2, making it difficult for at least part of the film layers of the light-emitting layer OL to be continuous in the first cut-off slot CU1 and the second cut-off slot CU2, so that at least part of the film layers of the light-emitting layer OL is disconnected, thereby achieving the purpose of preventing the carriers from moving between the light-emitting units LD, and in turn avoiding the cross-color caused by leakage.

The sidewall of the separation slot SES is a slope surface extending in the direction away from the driving backplane BP.

As shown in FIGS. 1 and 2, since there are a plurality of film layers in the light-emitting layer OL that may leak electricity, in order to ensure that the first cut-off slot CU1 and the second cut-off slot CU2 can prevent the leakage, the first cut-off slot CU1 and the second cut-off slot CU2 may be staggered in a direction perpendicular to the driving backplane BP, so that the second cut-off slot CU2 is at least partially located on a side of the first cut-off slot CU1 close to the driving backplane BP. With respect to the driving backplane BP, a position of the first cut-off slot CU1 is higher than a position of the second cut-off slot CU2. Even if the light-emitting layer OL has the plurality of film layers, the hole injection layer HIL1 closest to the driving backplane BP at least can be cut off. Furthermore, the position of the second cut-off slot CU2 is lower, and the light-emitting layer OL needs to be recessed to a greater depth, which is beneficial to cut off the charge generation layer CGL, which is farther away from the driving backplane BP than the hole injection layer HIL1. Please note that, at this time, the hole injection layer HIL1 may also be cut off. In this way, the plurality of film layers can be cut off by means of the first cut-off slot CU1 and the second cut-off slot CU2, reducing the risk of electric leakage and improving the cross-color.

The solution directed to the cross-color problem of the display panel according to this disclosure will be described in detail below.

As shown in FIG. 1 and FIG. 2, in order to achieve the above purpose, the pixel definition layer PDL may at least include an etching barrier layer PL1, a first definition layer PL2, and a second definition layer PL3 stacked in sequence in the direction away from the driving backplane BP, and the separation slot SES penetrates the second definition layer PL3 and the first definition layer PL2, and exposes the etching barrier layer PL1.

The etching barrier layer PL1 is partially stacked on a surface of the first electrode ANO away from the driving backplane BP, and partially located outside the first electrode ANO. When the separation slot SES is formed by an etching process, the etching barrier layer PL1 can limit the depth of the separation slot SES, improving the uniformity of the depth of the separation slot SES.

In some embodiments of the present disclosure, as shown in FIGS. 1 and 2, the etching barrier layer PL1 may include a buffer layer PL11 and a barrier layer PL12, wherein:

The buffer layer PL11 is partially stacked on the surface of the first electrode ANO away from the driving backplane BP, and partially located outside the first electrode ANO. The buffer layer PL11 may be made of an inorganic insulation material such as silicon oxide and silicon nitride. Alternatively, the buffer layer PL11 may also be made of other insulation materials.

The barrier layer PL12 may be disposed on a surface of the buffer layer PL11 away from the driving backplane BP. A material of the barrier layer PL12 is different from materials of the first definition layer PL2 and the second definition layer PL3, and with the same etching process, an etching degree of the first definition layer PL2 and the second definition layer PL3 is at least higher than an etching degree of the barrier layer PL12. The material of the barrier layer PL12 may include aluminum oxide. Alternatively, the barrier layer PL12 may also be made of other materials.

In other embodiments of the present disclosure, the etching barrier layer PL1 may adopt a single-layer structure, which may be the conductive material such as the metal or the metal oxide, but is spaced apart from the first electrode ANO. Alternatively, the etching barrier layer PL1 may also adopt three or more layers, as long as it can block the etching when the separation slot SES is formed.

The first definition layer PL2 is disposed on a surface of the etching barrier layer PL1 away from the driving backplane BP, and the second definition layer PL3 is disposed on a surface of the first definition layer PL2 away from the driving backplane BP. A material of the first definition layer PL2 is different from a material of the second definition layer PL3, for example, the material of the first definition layer PL2 is silicon nitride, and the material of the second definition layer PL3 may be silicon oxide. The different etching degrees of the two materials by the same etching process may be used to make the second definition layer PL3 protrude from an edge of the first definition layer PL2, thereby forming the first cut-off slot CU1 and the second cut-off slot CU2 in the first definition layer PL2.

As shown in FIG. 2, both the first cut-off slot CU1 and the second cut-off slot CU2 have two sidewalls distributed in the direction perpendicular to the driving backplane BP. A width W1 of the first cut-off slot CU1 is a distance between its two sidewalls, and a width W2 of the second cut-off slot CU2 is a distance between its two sidewalls. For any of the first cut-off slot CU1 and the second cut-off slot CU2, one of its sidewalls is a surface of the second definition layer PL3 close to the driving backplane BP, and the other sidewall is the surface of the etching barrier layer PL1 away from the driving backplane. The width of the first cut-off slot CU1 and the width of the second cut-off slot CU2, that is, a distance between the two sidewalls, may be limited by the etching barrier layer PL1 which is more difficult to be etched than the first definition layer PL2, improving the uniformity of the widths of the first cut-off slot CU1 and the second cut-off slot CU2, and avoid the situation where widths of different first cut-off slots CU1 have large deviations and widths of different second cut-off slots CU2 have large deviations. Accordingly, this is beneficial to improve the uniformity of a surface of the driving backplane BP. Since the pixel definition layer PDL itself includes the etching barrier layer PL1, there is no need to reserve a special space between the adjacent first electrodes ANO for providing the etching barrier layer PL1, which is conducive to shortening a distance between adjacent first electrodes ANO, that is, shortening a distance between the light-emitting units LD. In a case that a size of the display panel remains unchanged, it is beneficial to arrange more light-emitting units LD, thereby improving the resolution. It has been verified by experiments that the distance may be reduced to be shorter than 1 μm, while the distance in the existing display panels is typically above 1 μm.

In some embodiments of the present disclosure, due to the existence of the separation slot SES, the pixel definition layer PDL has a large step difference at the separation slot SES, and the light-emitting layer OL has a high degree of aggregation at the separation slot SES, so that the second cut-off slot CU2 bears a greater pressure than the first cut-off slot CU1, and the risk of collapse of the second cut-off slot CU2 in turn increases. If the collapse occurs, it is difficulty for the second cut-off slot CU2 to play the role of cutting off.

To this end, the present disclosure provides various means to solve this problem. Examples are given below.

Figure 8:
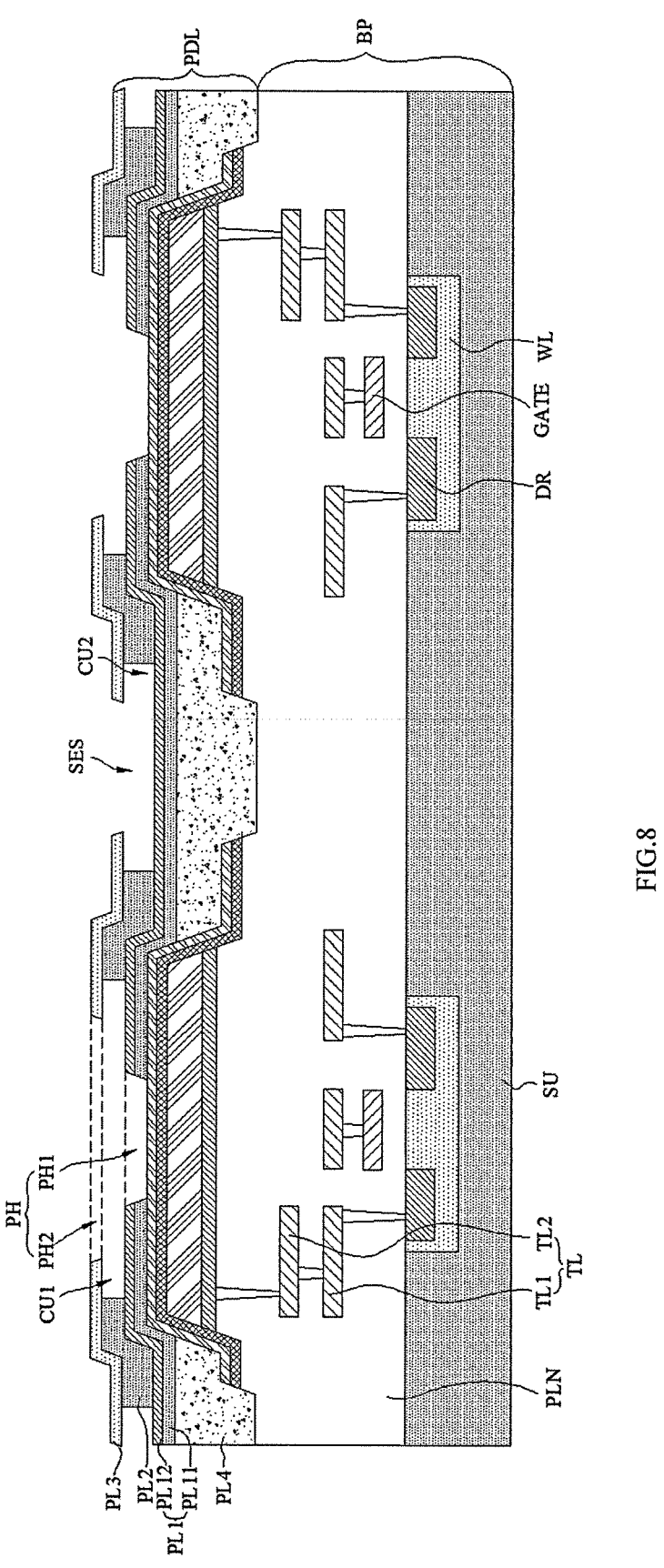
FIG. 8 is a partial cross-sectional view of a driving backplane, a first electrode and a pixel definition layer of a display panel according to an embodiment of the present disclosure.

In an embodiment, as shown in FIG. 8, a width of at least a partial area of the second cut-off slot CU2 is greater than the width of the first cut-off slot CU1. Alternatively, a width of any area of the second cut-off slot CU2 may be larger than the width of the first cut-off slot CU1, leaving a margin for the potential collapse. Even if the second cut-off slot CU2 collapses to a certain extent, it can still play the role of cutting off.

Figure 9:
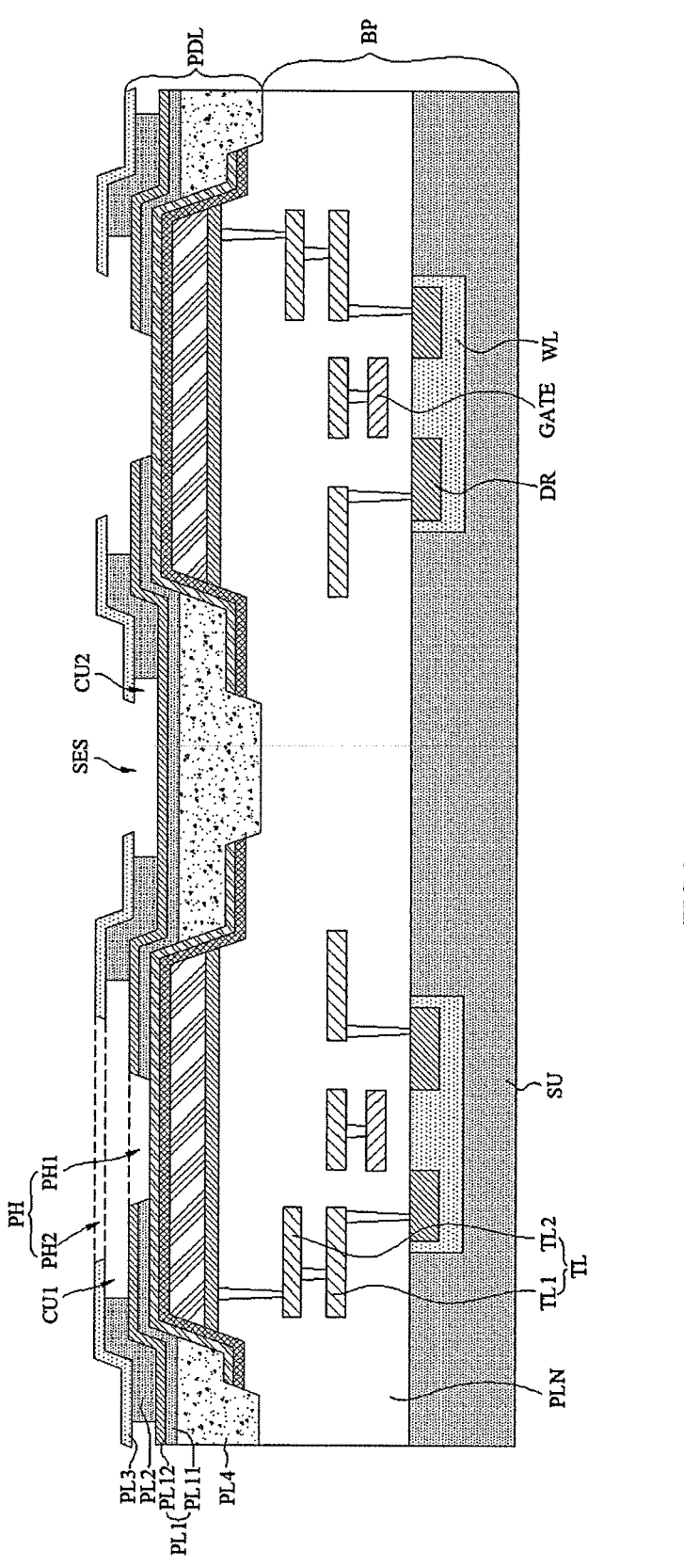
FIG. 9 is a partial cross-sectional view of a driving backplane, a first electrode and a pixel definition layer of a display panel according to another embodiment of the present disclosure.

In an embodiment, as shown in FIGS. 2 and 9, the sidewalls of the first cut-off slot CU1 and the second cut-off slot CU2 away from the driving backplane BP can be regarded as cantilevers relative to their respective bottom surfaces. The longer the cantilever, the longer the moment arm, and the greater the risk of collapse. In order to solve the problem of collapse, a depth d5 of the second cut-off slot CU2 can be made smaller than a depth d7 of the first cut-off slot CU1, and the depth d5 of the second cut-off slot CU2 may be the maximum distance between an end, away from the bottom surface of the cut-off slot CU2, of the sidewall of the cut-off slot CU2 and the bottom surface in a direction parallel to the driving backplane BP, thereby shortening the cantilever of the second cut-off slot CU2 and reducing the risk of collapse.

Figure 10:
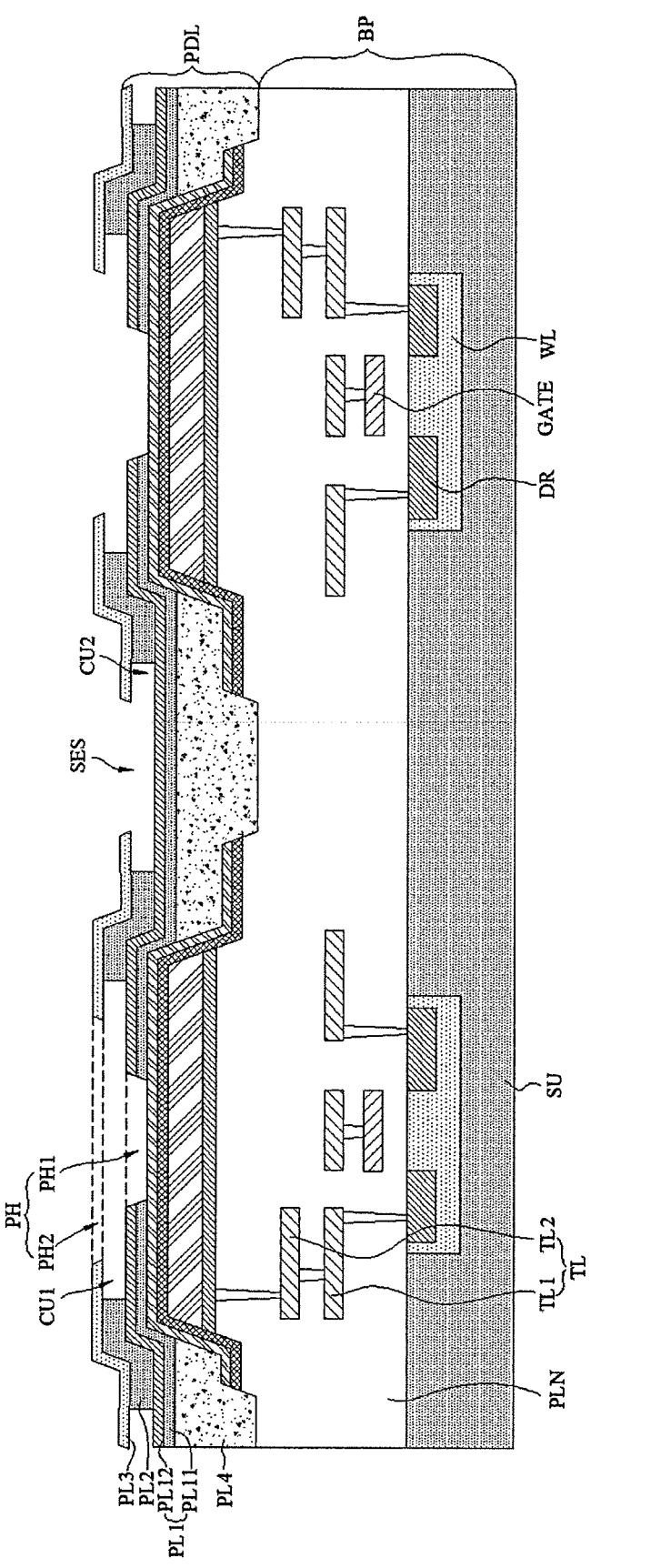
FIG. 10 is a partial cross-sectional view of a driving backplane, a first electrode and a pixel definition layer of a display panel according to yet another embodiment of the present disclosure.

In an embodiment, as shown in FIG. 10, an included angle between the sidewall of the second cut-off slot CU2 away from the driving backplane BP and the surface of the driving backplane BP on which the first electrode ANO is disposed may be greater than an included angle between the sidewall of the first cut-off slot CU1 away from the driving backplane BP and the surface of the driving backplane BP on which the first electrode ANO is disposed. That is to say, with respect to the sidewall of the first cut-off slot CU2 away from the driving backplane BP, the sidewall of the second cut-off slot CU2 away from the driving backplane BP is tilted in the direction away from the driving backplane BP, so as to prevent the collapse of the second cut-off slot CU2. Even if the second cut-off slot CU2 slightly collapses, there will be no situation where the two sidewalls are in contact with each other, thereby ensuring the cutting-off effect.

It should be noted that the above embodiments to solve the collapse problem may be applied individually, or one or more of them may be applied simultaneously, which, for example, will not be described in details herein.

In some embodiments of the present disclosure, as shown in FIG. 2, a length d7 of a sidewall among the two sidewalls of the first cut-off slot CU1 that is away from the driving backplane BP is not smaller than 0.03 μm and not greater than 0.05 μm, for example, 0.03 μm, 0.04 μm, 0.05 μm. The length d7 may be regarded as the depth of the first cut-off slot CU1.

In some embodiments of the present disclosure, as shown in FIG. 2, a length d5 of a sidewall among the two sidewalls of the second cut-off slot CU2 that is away from the driving backplane BP is not smaller than 0.07 μm and not greater than 0.1 μm, for example, 0.07 μm, 0.08 μm, 0.09 μm, 0.1 μm. The length d5 may be regarded as the depth of the second cut-off slot CU2.

In addition, in some embodiments of the present disclosure, the second cut-off slot CU2 may be located on a side of the first cut-off slot CU1 close to the driving backplane BP. A width difference between the first cut-off slot CU1 and the second cut-off slot CU2 is smaller than a width of one of the first cut-off slot CU1 and the second cut-off slot CU2.

It should be noted that a width difference between A and B herein is an absolute value of a difference between the width of A and the width of B. For example, a width difference between the first cut-off slot CU1 and the second cut-off slot CU2 is an absolute value of a difference between widths of the first cut-off slot CU1 and the second cut-off slot CU2, so the width difference must be greater than or equal to 0.

Figure 5:
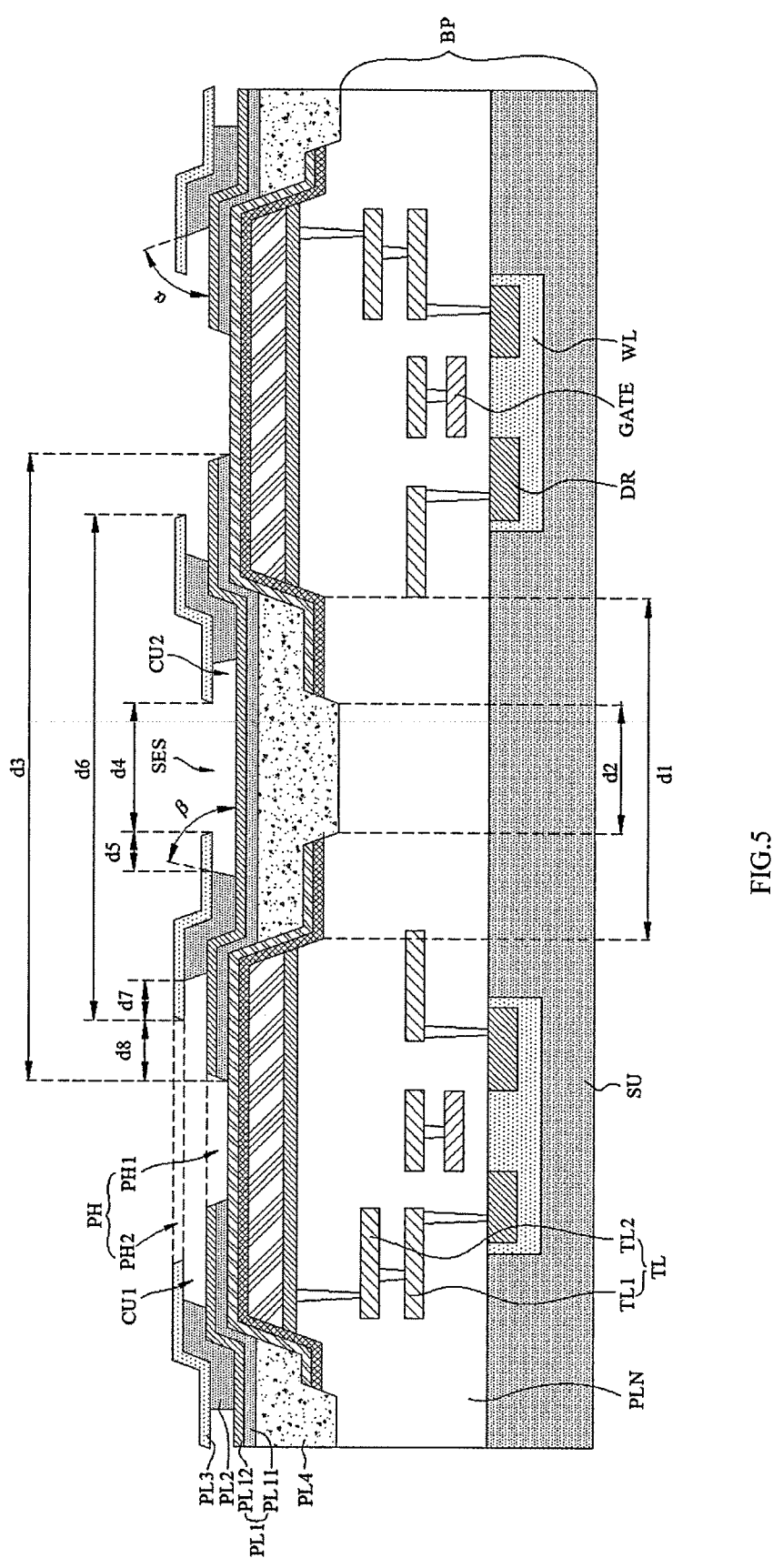
FIG. 5 is a partial cross-sectional view of a driving backplane, a first electrode and a pixel definition layer of a display panel according to another embodiment of the present disclosure.

In some embodiments of the present disclosure, as shown in FIG. 5, the bottom surface of the first cut-off slot CU1 is a slope surface which makes a depth of the first cut-off slot CU1 decrease in the direction away from the driving backplane BP. A slope of the slope surface is α, which may refer to an included angle between the slope surface and a surface where it is located.

The bottom surface of the second cut-off slot CU2 is a slope surface which makes a depth of the second cut-off slot CU21 decrease in the direction away from the driving backplane BP. A slope of the slope surface is β. The slope β may refer to an included angle between the slope surface and a surface where it is located. The slope β may be smaller than the slope α.

In some embodiments of the present disclosure, as shown in FIGS. 1 and 2, the pixel definition layer PDL may further include a filling layer PL4, which may be disposed on the same side of the driving backplane BP as the first electrode, for example, both the filling layer PL4 and the first electrode are disposed on the planarization layer PLN. The filling layer PL4 may separate individual first electrodes ANO and be in contact with sidewalls of the first electrodes ANO. The filling layer PL4 may be regarded as a film layer with a plurality of through holes, and the individual first electrodes ANO may be disposed in respective through holes in a one-to-one correspondence. Furthermore, the etching barrier layer PL1 is partially stacked on a surface of the filling layer PL4 away from the driving backplane BP, and partially located on the surface of the first electrode ANO away from the driving backplane BP. The filling layer PL4 may further fill the first groove FL1 and the second groove FL2. A material of the filling layer PL4 may be silicon oxide. Alternatively, the material of the filling layer PL4 may also be other insulation materials such as silicon nitride.

In some embodiments of the present disclosure, as shown in FIG. 1, for the first electrode ANO including the first conductive layer AL1 to the second conductive protection layer AL4, a thickness of the etching barrier layer PL1 may be greater than a thickness of any of the first conductive layer AL1 to the second conductive protection layer AL4, but may be smaller than the sum of the thicknesses of the first conductive layer AL1 to the second conductive protection layer AL4.

In some embodiments of the present disclosure, as shown in FIG. 1 and FIG. 2, the surface of the filling layer PL4 away from the driving backplane BP is located on a side, close to the driving backplane BP, of the surface of the first electrode ANO away from the driving backplane BP, so that the etching barrier layer PL1 and the first definition layer PL2 and the second definition layer PL3 on it can be recessed at the filling layer PL4.

As shown in FIG. 2, the pixel definition layer PDL may include an edge portion PE, a middle portion PM, and a connection portion PS. The edge portion PE is located on the surface of the first electrode ANO away from the driving backplane BP, and the edge portion PE includes the etching barrier layer PL1, the first definition layer PL2, and the second definition layer PL3. The pixel opening PH is located at the edge portion PE.

The middle portion PM is located between two adjacent first electrodes ANO, and includes the filling layer PL4 to the second definition layer PL3. An orthographic projection of the middle portion PM on the driving backplane BP is not overlapped with an orthographic projection of the first electrode ANO on the driving backplane BP.

The connection portion PS is connected between the edge portion PE and the middle portion PM. Since the etching barrier layer PL1 and the first definition layer PL2 and the second definition layer PL3 on it are recessed at the filling layer PL4, the middle portion PM needs the connection portion PS to extend to the surface of the first electrode ANO away from the driving backplane BP to obtain the edge portion PE. The separation slot SES may be opened in the middle portion PM.

A slope of the connection portion PS is smaller than slopes of the bottom surface of the first cut-off slot CU1 and the bottom surface of the second cut-off slot CU2.

Alternatively, in other embodiments of the present disclosure, the surface of the filling layer PL4 away from the driving backplane BP may also be located on the same plane as the surface of the first electrode ANO away from the driving backplane BP, so as to fill and level up the space between adjacent first electrodes ANO, and the etching barrier layer PL1 extends along this plane.

In some embodiments of the present disclosure, a sidewall of at least one pixel opening PH is provided with a plurality of first cut-off slots CU1 distributed along a circumferential direction, and adjacent first cut-off slots CU1 may be in communication with each other, or arranged in a staggered manner, which is not specifically limited here. At least two first cut-off slots CU1 of the same pixel opening PH have different widths, and a first cut-off slot CU1 with a larger width can cut off a film layer in the light-emitting layer OL that is farther away from the driving backplane BP.

As shown in FIG. 6, at least one pixel opening PH has a first cut-off slot CU11 and a first cut-off slot CU12. A width W12 of the first cut-off slot CU12 is larger than a width W11 of the first cut-off groove CU11, and the width W11 of the first cut-off slot CU11 is larger than a width W2 of the second cut-off slot CU2.

Figure 7:
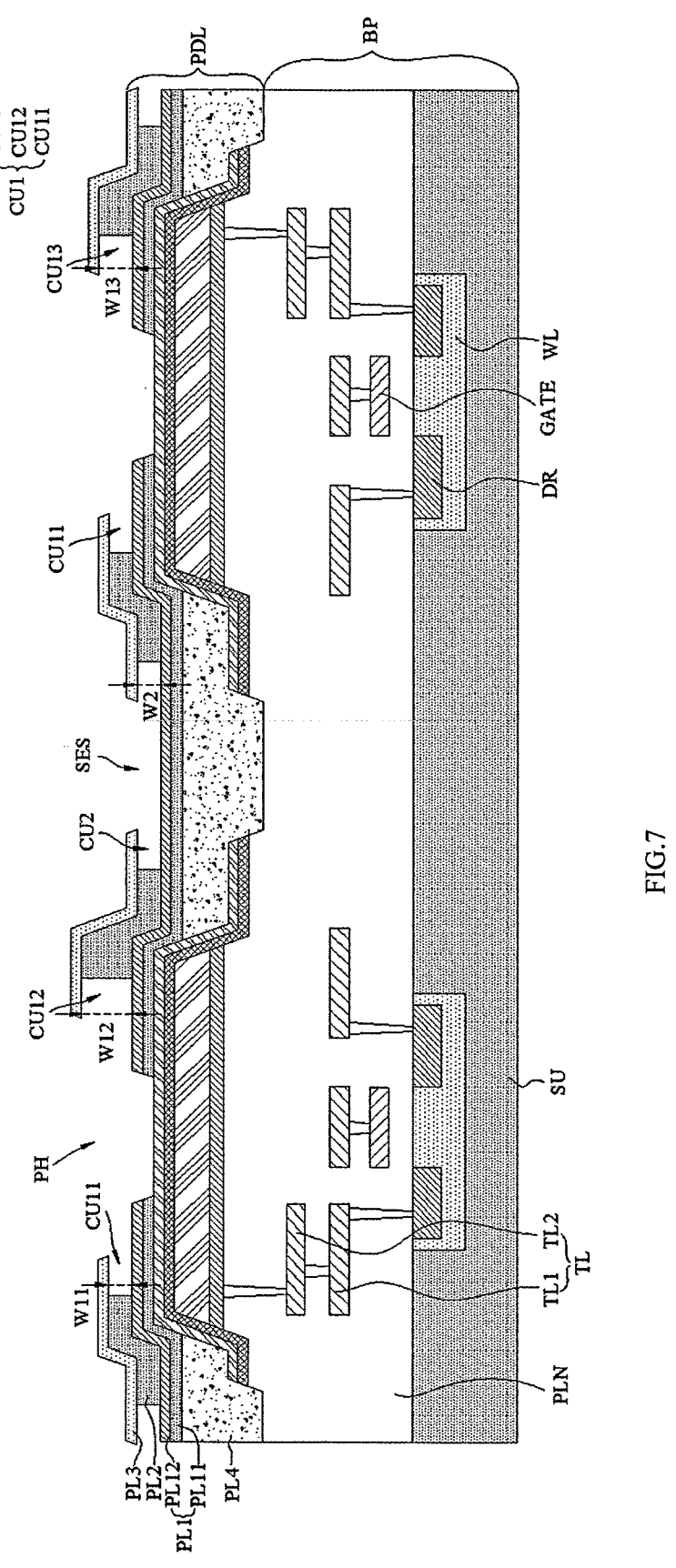
FIG. 7 is a partial cross-sectional view of a display panel according to an embodiment of the present disclosure.

As shown in FIG. 7, at least one pixel opening PH has a first cut-off slot CU11 and a first cut-off slot CU12. A width W12 of the first cut-off slot CU12 is greater than a width W11 of the first cut-off slot CU11, and the width W11 of the first cut-off slot CU11 is equal to a width W2 of the second cut-off groove CU2. Furthermore, the at least one pixel opening PH has the first cut-off groove CU11 and a first cut-off slot CU13, and a width W13 of the first cut-off slot CU13 is greater than the width W11 of the first cut-off slot CU11.

In some embodiments of the present disclosure, the number of light-emitting sub-layers OLP is three, and the number of charge generation layers CGL is two. The hole injection layer HIL1 may be cut off by the first cut-off slot CU11, while the charge generation layer CGL may extend continuously. The first cut-off slot CU12 may cut off the hole injection layer HIL1 and one of the two charge generation layers CGL, and the other charge generation layer CGL may extend continuously. The second cut-off slot CU2 may cut off the hole injection layer HIL1 and the charge generation layer CGL closer to the driving backplane BP.

Therefore, on the basis of preventing the crosstalk problem by cutting off one of the two charge generation layers CGL and the hole injection layer HIL1, it is possible to reduce positions where both the hole injection layer HIL1 and the two charge generation layers CGL are cut off, preventing the cut-off charge generation layer CGL from contacting the first electrode ANO after extending to the driving backplane BP, thereby reducing the risk of internal short circuit of the light-emitting unit LD.

Further, among two first cut-off slots CU1 with different widths of the same pixel opening PH, a width of one first cut-off slot CU1 is 0.8 to 1.2 times a width of the other first cut-off slot CU1. For example, as shown in FIGS. 6 and 7, the width of the first cut-off slot CU12 is 0.8 to 1.2 times the width W13 of the first cut-off slot CU13, and the width W13 of the first cut-off slot CU13 is 0.8 to 1.2 times the width W11 of the first cut-off slot CU11.

In some embodiments of the present disclosure, the number of light-emitting sub-layers OLP is two, and the number of charge generation layer CGL is one. Its structure is as described above in the embodiments of the two light-emitting sub-layers OLP. A light-emitting sub-layer OLP farther from the driving backplane BP includes a light-emitting material layer B-EML that emits the blue light.

A distance between the light-emitting material layer B-EML that emits the blue light and the charge generation layer CGL within the pixel opening PH is greater than a distance between the light-emitting material layer B-EML that emits the blue light and the charge generation layer CGL within a range of the pixel definition layer PDL, so that the light-emitting layer OL within the range of the pixel opening PH range can emit light normally, while the light-emitting layer OL within the range of the pixel definition layer PDL does not need to emit light.

The inventors found that in a case that the hole injection layer HIL1 of the light-emitting layer OL is cut off at the first cut-off slot CU1, if the charge generation layer CGL is not cut off, it may bend toward the first electrode ANO, and finally may directly overlap with the first electrode ANO, resulting in the short circuit. To this end, as shown in FIG. 2, in some embodiments of the present disclosure, the pixel opening PH includes a first segment PH1 and a second segment PH2 distributed in the direction perpendicular to the driving backplane BP. The first segment PH1 is located at the etching barrier layer PL1, the second segment PH2 is located at the second definition layer PL3, and the first cut-off slot CU1 is located between the first segment PH1 and the second segment PH2. A boundary of an orthographic projection of the second segment PH2 on the driving backplane BP surrounds outside a boundary of an orthographic projection of the first segment PH1 on the driving backplane BH. That is to say, a range that the etching barrier layer PL1 extends to the first electrode ANO is greater than a range that the second definition layer PL3 extends to the first electrode ANO. Even if the charge generation layer CGL is bent toward the first electrode ANO, that is, it overlaps with the etching barrier layer PL1, the etching barrier layer PL1 is insulated from the first electrode ANO, and accordingly, the short circuit between the charge generation layer CGL and the first electrode ANO will not be caused.

Further, in some embodiments of the present disclosure, a distance d8 between the boundary of the orthographic projection of the second segment PH2 on the driving backplane BH and the boundary of the orthographic projection of the first segment PH1 on the driving backplane BP is not greater than 0.2 μm and not smaller than 0.06 μm, for example, 0.06 μm, 0.08 μm, 0.1 μm, 0.2 μm, etc.

In some embodiments of the present disclosure, as shown in FIG. 2, a distance d3 between portions of two adjacent pixel openings PH located at the first segment PH1 is not greater than 1.9 μm and not smaller than 1.1 μm, for example, 1.1 μm, 1.4 μm, 1.7 μm, 1.9 μm, etc.

In some embodiments of the present disclosure, as shown in FIG. 2, a distance d6 between portions of the two adjacent pixel openings PH located at the second segment PH2 is not greater than 1.6 μm and not smaller than 0.9 μm, for example, 0.9 μm, 1.1 μm, 1.3 μm, 1.5 μm, 1.6 μm.

In some embodiments of the present disclosure, the distance d6 between two adjacent pixel openings PH and a width d4 of the separation slot SES satisfy the following relationship:

$$(d6 - d4)/2 > d4;$$

A half of a difference between the distance d6 between the two adjacent pixel openings PH and the width d4 of the separation slot SES is greater than the width d4 of the separation slot SES.

As shown in FIG. 1, based on the topography of the above-mentioned pixel definition layer PDL and light-emitting layer OL, a planarization portion CATp may be formed in a region of the second electrode CAT corresponding to the first electrode ANO, and a groove portion may be formed in a region thereof corresponding to the separation slot SES. A smooth transition may be present at the connection between the groove portion CATg and the planarization portion CATp through a transition portion CATi, so as to avoid sharp corners of the second electrode CAT. The separation slot SES is filled by the light-emitting layer OL, such that the depth of the groove portion CATg of the second electrode CAT is smaller than that of the separation slot SES.

Embodiments of the present disclosure further provide a display device, which may include the display panel in any of the above embodiments. The specific structure and beneficial effects of the display panel have been described in detail in the forgoing embodiments of the display panel, and will not be described in detail here. The display device according to the present disclosure may be used in electronic devices with image display functions, such as watches, bracelets, mobile phones, and tablet computers, and will not be elaborated here.

Other embodiments of the present disclosure will be readily apparent to those skilled in the art from consideration of the specification and practice of the application disclosed herein. This application is intended to cover any modification, use or adaptation of the present disclosure, and these modifications, uses or adaptations follow the general principles of the present disclosure and include common knowledge or conventional technical means in the technical field not disclosed in the present disclosure. The specification and embodiments are to be considered exemplary only, with the actual scope and spirit of the disclosure being indicated by the appended claims.

What is claimed is:

1. A display panel, comprising:
a driving backplane;
a first electrode, disposed on a side of the driving backplane;
a pixel definition layer, disposed on a same side of the driving backplane as the first electrode, and provided with a pixel opening exposing each first electrode and a separation slot between two adjacent pixel openings, wherein a boundary of the pixel opening is located within a boundary of a first electrode exposed by the pixel opening; a sidewall of the pixel opening is provided with a first cut-off slot, and a sidewall of the separation slot is provided with a second cut-off slot; and the first cut-off slot is at least partially located on a side of the second cut-off slot away from the driving backplane;
a light-emitting layer, by which the pixel definition layer and the first electrode are covered; and
a second electrode, by which the light-emitting layer is covered.

2. The display panel according to claim 1, wherein the pixel definition layer comprises an etching barrier layer, a first definition layer and a second definition layer stacked in sequence in a direction away from the driving backplane;
the etching barrier layer, the first definition layer and the second definition layer are penetrated by the pixel opening, the first definition layer and the second definition layer are penetrated by the separation slot, and the etching barrier layer is exposed by the separation slot;
the first cut-off slot and the second cut-off slot are located at the first definition layer;
wherein the etching barrier layer comprises:
a buffer layer, at least partially disposed on a surface of the first electrode away from the driving backplane; and
a barrier layer, stacked on a surface of the buffer layer away from the driving backplane, wherein the first definition layer is stacked on a surface of the barrier layer away from the driving backplane.

3. The display panel according to claim 2, wherein the pixel opening comprises a first segment located at the etching barrier layer and a second segment located at the second definition layer, and a boundary of an orthographic projection of the second segment on the driving backplane surrounds outside a boundary of an orthographic projection of the first segment on the driving backplane.

4. The display panel according to claim 3, wherein a distance between the boundary of the orthographic projection of the second segment on the driving backplane and the boundary of the orthographic projection of the first segment on the driving backplane is not greater than 0.2 μm and not smaller than 0.06 μm; and
wherein a distance between portions of two adjacent pixel openings located in the first segment is not greater than 1.9 μm and not smaller than 1.1 μm; and
a distance between portions of the two adjacent pixel openings located in the second segment is not greater than 1.6 μm and not smaller than 0.9 μm.

5. The display panel according to claim 1, wherein a length of a sidewall away from the driving backplane among two sidewalls of the first cut-off slot is not smaller than 0.03 μm and not greater than 0.05 μm; and
wherein a length of a sidewall away from the driving backplane among two sidewalls of the second cut-off slot is not smaller than 0.07 μm and not greater than 0.1 μm.

6. The display panel according to claim 2, wherein the pixel definition layer further comprises:
a filling layer, disposed on the same side of the driving backplane as the first electrode, and separating each first electrode, wherein the etching barrier layer is partially stacked on a surface of the filling layer away from the driving backplane;
wherein the surface of the filling layer away from the driving backplane is located on a side close to the driving backplane of a surface of the first electrode away from the driving backplane; and
the pixel definition layer comprises an edge portion, a middle portion and a connection portion, wherein the edge portion is located on the surface of the first electrode away from the driving backplane, the middle portion is located between two adjacent first electrodes, and the connection portion is connected to the edge portion and the middle portion.

7. The display panel according to claim 6, wherein the sidewall of the separation slot is a slope surface expanding in the direction away from the driving backplane;

wherein a bottom surface of the first cut-off slot is a slope surface which makes a depth of the first cut-off slot decrease in the direction away from the driving backplane; and a bottom surface of the second cut-off slot is a slope surface which makes a depth of the second cut-off slot decrease in the direction away from the driving backplane;

wherein a slope of the connection portion is smaller than slopes of the bottom surface of the first cut-off slot and the bottom surface of the second cut-off slot.

8. The display panel according to claim 1, wherein an orthographic projection of the first cut-off slot on the driving backplane is located within an orthographic projection of the first electrode on the driving backplane.

9. The display panel according to claim 1, wherein at least a partial area of the second cut-off slot has a width greater than a width of the first cut-off slot; and wherein a depth of the second cut-off slot is smaller than a depth of the first cut-off slot.

10. The display panel according to claim 1, wherein an comprised angle between a sidewall of the second cut-off slot away from the driving backplane and a surface of the driving backplane on which the first electrode is disposed is greater than an comprised angle between a sidewall of the first cut-off slot away from the driving backplane and the surface of the driving backplane on which the first electrode is disposed.

11. The display panel according to claim 1, wherein a width difference between the first cut-off slot and the second cut-off slot is smaller than a width of one of the first cut-off slot and the second cut-off slot; and wherein a half of a difference between a distance between two adjacent pixel openings and a width of the separation slot is greater than the width of the separation slot.

12. The display panel according to claim 1, wherein the first electrode comprises:

a first conductive layer, disposed on the side of the driving backplane;

a second conductive layer, stacked on a surface of the first conductive layer away from the driving backplane; and a first conductive protection layer, by which a surface of the second conductive layer away from the driving backplane and sidewalls of the second conductive layer and the first conductive layer are covered.

13. The display panel according to claim 12, wherein the first electrode further comprises a second conductive protection layer, by which the first conductive protection layer is covered; and wherein a surface of the driving backplane on which the first electrode is disposed is provided with a first groove, and a second groove is disposed at a bottom of the first groove; and areas of a sidewall and a bottom surface of the first groove that are located outside the second groove are covered by the first conductive protection layer and the second conductive protection layer.

14. The display panel according to claim 12, wherein a width of the separation slot is equal to a width of the second groove; and wherein a width of the first groove is not smaller than 0.5 μm and not greater than 1.2 μm, and a width of the second groove is not smaller than 0.2 μm and not greater than 0.9 μm.

15. The display panel according to claim 1, wherein the light-emitting layer comprises a hole injection layer and a light-emitting sub-layer disposed on a side of the hole injection layer away from the driving backplane;

Wherein two adjacent light-emitting sub-layers are coupled in series through a charge generation layer between the two adjacent light-emitting sub-layers;

the light-emitting sub-layer comprises a hole transport layer, at least one light-emitting material layer, and an electron transport layer disposed in a direction away from the driving backplane;

the hole injection layer is disconnected at the first cut-off slot; and at least one charge generation layer is disconnected at the second cut-off slot.

16. The display panel according to claim 15, wherein a sidewall of at least one pixel opening is provided with a plurality of first cut-off slots distributed in a circumferential direction; and at least two first cut-off slots of a same pixel opening have different widths.

17. The display panel according to claim 16, wherein a number of light-emitting sub-layers is three, and a number of charge generation layers is two; and in two first cut-off slots with different widths of the same pixel opening, a width difference between the two first cut-off slots is 0.8 to 1.2 times a width difference between one of the first cut-off slots and the second cut-off slot.

18. The display panel according to claim 15, wherein a number of the light-emitting sub-layers is two, and a number of charge generation layers is one; a light-emitting sub-layer farther from the driving backplane comprises a light-emitting material layer that emits blue light; and a distance between the light-emitting material layer that emits the blue light and the charge generation layer within the pixel opening is greater than a distance between the light-emitting material layer that emits the blue light and the charge generation layer within a range of the pixel definition layer.

19. The display panel according to claim 1, wherein a planarization portion is formed by the second electrode in an area corresponding to the first electrode, and a depression portion is formed by the second electrode in an area corresponding to the separation slot, and a smooth transition is formed between the depression portion and the planarization portion.

20. A display device, comprising a display panel, wherein the display panel comprises:

a driving backplane;

a first electrode, disposed on a side of the driving backplane;

a pixel definition layer, disposed on a same side of the driving backplane as the first electrode, and provided with a pixel opening exposing each first electrode and a separation slot between two adjacent pixel openings, wherein a boundary of the pixel opening is located within a boundary of a first electrode exposed by the pixel opening; a sidewall of the pixel opening is provided with a first cut-off slot, and a sidewall of the separation slot is provided with a second cut-off slot;

and the first cut-off slot is at least partially located on a side of the second cut-off slot away from the driving backplane;

a light-emitting layer, by which the pixel definition layer and the first electrode are covered; and a second electrode, by which the light-emitting layer is covered.

\* \* \* \* \*